(12) United States Patent
Lim et al.

(10) Patent No.: US 8,878,792 B2
(45) Date of Patent: Nov. 4, 2014

(54) CLOCK AND DATA RECOVERY CIRCUIT OF A SOURCE DRIVER AND A DISPLAY DEVICE

(75) Inventors: Jung-Pil Lim, Ulwang-si (KR); Jae-Youl Lee, Yongin-si (KR); Han-Su Pae, Hwaseong-si (KR); Dong-Hoon Baek, Seoul (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 1121 days.

(21) Appl. No.: 12/832,319

(22) Filed: Jul. 8, 2010

(65) Prior Publication Data

US 2011/0037758 A1 Feb. 17, 2011

(30) Foreign Application Priority Data

Aug. 13, 2009 (KR) .................. 10-2009-0074856
Aug. 26, 2009 (KR) .................. 10-2009-0079157

(51) Int. Cl.
| | |
|---|---|
| G06F 3/041 | (2006.01) |
| H03L 7/08 | (2006.01) |
| H04L 25/02 | (2006.01) |
| H03L 7/081 | (2006.01) |
| H04L 7/04 | (2006.01) |
| H04L 7/08 | (2006.01) |
| H04L 7/00 | (2006.01) |
| G09G 5/00 | (2006.01) |

(52) U.S. Cl.
CPC .............. H04L 7/044 (2013.01); H03L 7/0805 (2013.01); *H04L 7/046* (2013.01); H04L 25/0272 (2013.01); *H04L 7/08* (2013.01); *H04L 7/0004* (2013.01); H03L 7/0816 (2013.01); *G09G 2310/0275* (2013.01); *G09G 5/008* (2013.01)

USPC ........ 345/173; 345/156; 345/204; 178/18.01; 178/18.03; 178/20.01

(58) Field of Classification Search
USPC .......................... 345/87, 213, 156, 173–184; 178/18.01–18.09, 19.01–19.04, 20.01
See application file for complete search history.

(56) References Cited

U.S. PATENT DOCUMENTS

| | | | |
|---|---|---|---|
| 6,028,903 A | 2/2000 | Drost et al. | |
| 7,154,495 B1 * | 12/2006 | Bucklen | 345/213 |
| 2007/0091991 A1 | 4/2007 | Sartschev et al. | |
| 2007/0171161 A1 | 7/2007 | Lin | |
| 2008/0075222 A1 * | 3/2008 | Lee et al. | 375/376 |
| 2008/0130811 A1 * | 6/2008 | Bae et al. | 375/355 |
| 2008/0136480 A1 * | 6/2008 | Boerstler et al. | 327/173 |

FOREIGN PATENT DOCUMENTS

| | | |
|---|---|---|
| KR | 10-0408393 | 11/2003 |
| KR | 10-0714382 | 4/2007 |
| KR | 10-2009-0010579 | 1/2009 |

* cited by examiner

*Primary Examiner* — Srilakshmi K Kumar
*Assistant Examiner* — Insa Sadio
(74) *Attorney, Agent, or Firm* — Harness, Dickey & Pierce, P.L.C.

(57) ABSTRACT

A clock and data recovery (CDR) circuit of a source driver includes a clock recovery unit and a delay locked loop unit. The clock recovery unit receives data bits and a clock code periodically inserted into the data bits through a clock embedded data channel in a display data mode, and is configured to generate a clock signal by detecting an edge of the clock code. The delay locked loop unit is configured to generate a multiphase clock signal based on the clock signal in the display data mode.

19 Claims, 30 Drawing Sheets

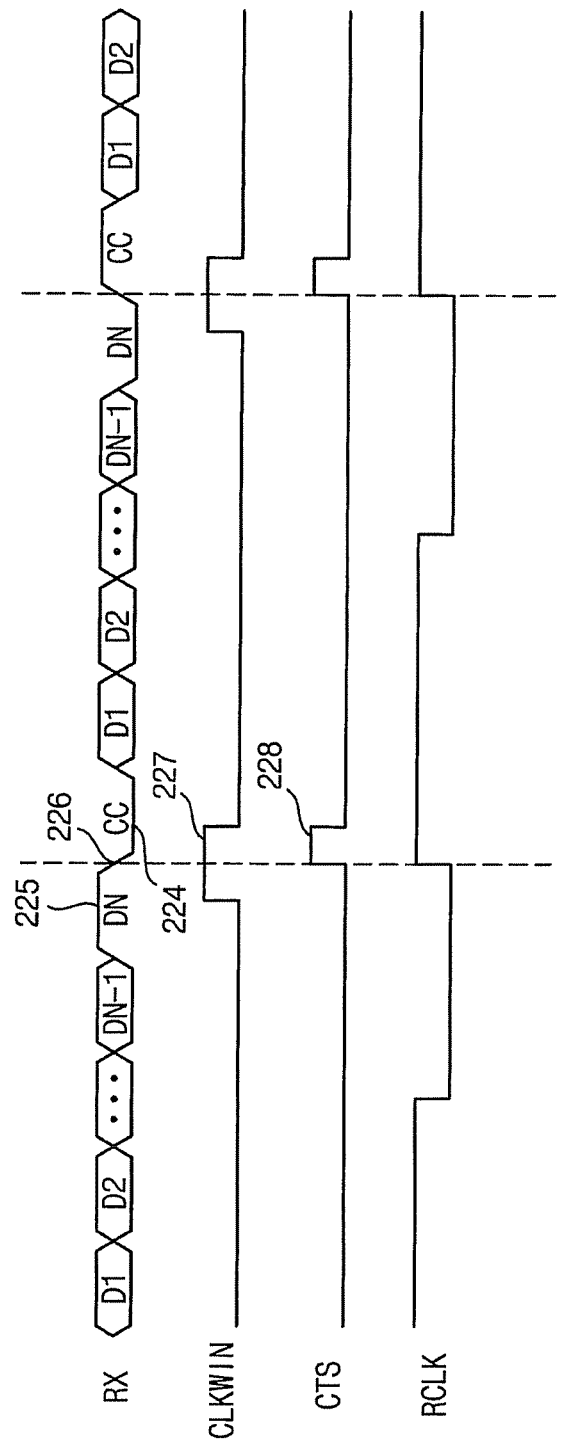

FIG. 11
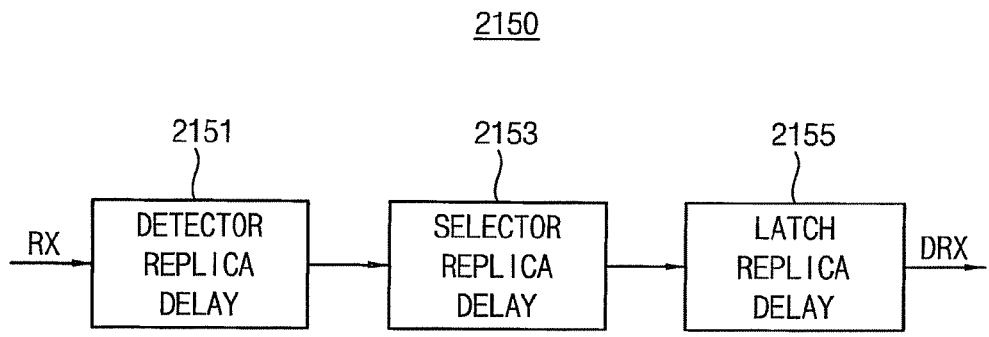
FIG. 12
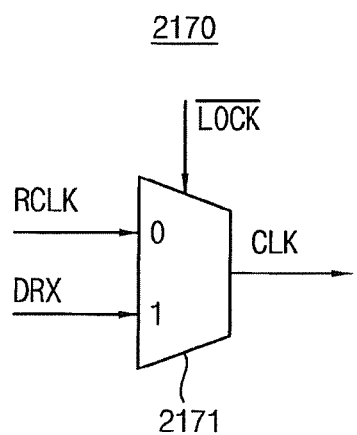
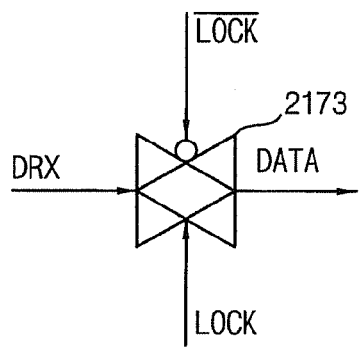

US 8,878,792 B2

CLOCK AND DATA RECOVERY CIRCUIT OF A SOURCE DRIVER AND A DISPLAY DEVICE

CROSS-REFERENCE TO RELATED APPLICATION(S)

This application claims priority under 35 U.S.C §119 to Korean Patent Application No. 2009-0074856, filed on Aug. 13, 2009, in the Korean Intellectual Property Office (KIPO), the contents of which are incorporated herein in its entirety by reference, and to Korean Patent Application No. 2009-0079157, filed on Aug. 26, 2009, in the Korean Intellectual Property Office (KIPO), the contents of which are incorporated herein in its entirety by reference.

BACKGROUND

1. Technical Field

Example embodiments relate to an intra-panel interface, and more particularly to a clock and data recovery circuit of a source driver and a display device.

2. Description of the Related Art

A display device employs an intra-panel interface for transferring data from a timing controller to source drivers. For example, reduced swing differential signaling (RSDS), mini low voltage differential signaling (mini-LVDS), point-to-point differential signaling (PPDS), and low current differential signaling have been developed as the intra-panel interface.

Since data and a clock signal are separately transmitted through a data line and a clock signal line, respectively, these conventional interfaces have an inevitable skew issue. In particular, in a display device using a chip-on-glass (COG) technology where the source drivers are directly bonded on a glass substrate, the conventional interfaces cannot transmit the data at high speed without a skew. Accordingly, an improved interface is required for high speed serial data transmission on the glass substrate.

SUMMARY

Some example embodiments provide a clock and data recovery circuit of a source driver accurately recovering a clock signal from clock embedded data.

Some example embodiments provide a display device transmitting data and a clock signal at high speed without a clock signal line by employing a clock embedding technology.

According to example embodiments, a clock and data recovery (CDR) circuit of a source driver may include a clock recovery unit and a delay locked loop unit. The clock recovery unit may be configured to receive data bits and a clock code periodically inserted into the data bits through a clock embedded data channel in a display data mode, and generates a clock signal by detecting an edge of the clock code. The delay locked loop unit may be configured to generate a multi-phase clock signal based on the clock signal in the display data mode.

The clock recovery unit may be configured to receive a clock training signal through the clock embedded data channel in a training mode, and outputs the clock training signal to the delay locked loop unit, and the delay locked loop unit may be configured to lock in response to the clock training signal output from the clock recovery unit in the training mode.

The delay locked loop unit may be configured to generate a clock window signal based on the multi-phase clock signal such that the clock window signal has a logic high level while the clock code transitions, and the clock recovery unit may be configured to detect the edge of the clock code in response to the clock window signal.

The clock recovery unit may include a clock code detecting unit configured to detect the edge of the clock code in response to the clock window signal, and to generate a clock transition signal based on the detected edge, a clock signal generating unit configured to generate a recovered clock signal in response to the clock transition signal, and an output unit configured to output the recovered clock signal as the clock signal.

The clock code detecting unit may include a rising detector configured to generate a rising edge detection signal by detecting a rising edge of the clock code, a falling detector configured to generate a falling edge detection signal by detecting a falling edge of the clock code, a rise-fall determiner configured to generate a rise-fall decision signal by determining whether the clock code has the rising edge or the falling edge, and a selector configured to selectively output the rising edge detection signal or the falling edge detection signal as the clock transition signal in response to the rise-fall decision signal.

The clock signal generating unit may include a delay circuit configured to generate a delayed clock transition signal by delaying the clock transition signal, and a set-reset latch having a set terminal that receives the clock transition signal, a reset terminal that receives the delayed clock transition signal, and an output terminal that outputs the recovered clock signal.

The CDR circuit may further include a delay circuit configured to delay the data bits and the clock code by a delay time of the clock code detecting unit and the clock signal generating unit in the display data mode, and to delay a clock training signal received through the clock embedded data channel by the delay time in a training mode.

The output unit may be configured to output the clock training signal received from the delay circuit in the training mode, and may be configured to output the recovered clock signal received from the clock signal generating unit as the clock signal in the display data mode.

The delay locked loop unit may include a delay line configured to delay the clock signal to generate a delayed clock signal, the delay line including a plurality of delay cells, the plurality of delay cells outputting the multi-phase clock signal by sequentially delaying the clock signal, a phase-frequency detector configured to generate an up signal and a down signal based on a phase difference between the clock signal and the delayed clock signal, a control signal generator configured to generate a delay control signal for controlling a delay time of the delay line in response to the up signal and the down signal, a lock detector configured to generate a lock signal indicating whether the delay locked loop unit is locked based on the up signal and the down signal, and a clock window generator configured to generate a clock window signal by performing a logical operation on the multi-phase clock signal.

The clock window generator may include a window signal generating unit configured to generate a first window signal by performing a logical operation on first and second clock signals of the multi-phase clock signal, to generate a second window signal by performing a logical operation on third and fourth clock signals of the multi-phase clock signal, and to selectively output the first window signal or the second window signal as the clock window signal in response to a window selection signal, the third and fourth clock signals being respectively adjacent to the first and second clock signal, and a window signal selecting unit configured to generate the window selection signal by detecting a time interval between a rising edge of the first window signal and the edge of the clock code.

According to example embodiments, a display device includes a display panel, a timing controller and a plurality of source drivers. The display panel displays an image. The timing controller periodically inserts a clock code into data bits, and transmits the data bits and the clock code through clock embedded data channels in a display data mode. The plurality of source drivers receive the data bits and the clock code through the clock embedded data channels in the display data mode, generate a clock signal by detecting an edge of the clock code, sample the data bits based on the clock signal, and drive the display panel based on the sampled data bits.

The timing controller may be configured to transmit a clock training signal through the clock embedded data channels in a training mode, and CDR circuits included in the plurality of source drivers may be configured to lock in response to the clock training signal received through the clock embedded data channels in the training mode.

The clock embedded data channels may be coupled between the timing controller and the plurality of source drivers in a point-to-point topology.

The plurality of source drivers may be configured to transmit lock state information about whether CDR circuits included in the plurality of source drivers are locked or unlocked to the timing controller through a shared back channel.

In some embodiments, when one of the CDR circuits is unlocked, a source driver including the unlocked CDR circuit may be configured to change a voltage of the shared back channel to transmit the lock state information.

In other embodiments, the timing controller may be configured to transmit order information to the plurality of source drivers through the clock embedded data channels, and each source driver may be configured to change a voltage of the shared back channel during a corresponding response time indicated by the order information to transmit the lock state information.

The shared back channel may be shared by the plurality of source drivers. The shared back channel may be coupled between the timing controller and the plurality of source drivers in a daisy chain topology or in a multi-drop topology.

The timing controller may be configured to transmit data packets mapped to the data bits to the plurality of source drivers through the clock embedded data channels in the display data mode. The data packets may be respectively correspond to lines of an image frame. Each data packet may include a line start field indicating a start of a line of the image frame, a configuration field including configuration data for controlling the plurality of source drivers, a pixel data field including image data, a wait field assigned for the plurality of source drivers to have a time to receive and to store the image data, and a horizontal blank field assigned for the plurality of source drivers to have a time to drive the display panel based on the image data.

The timing controller may be configured to generate a modulated clock signal by adjusting at least one of a rising edge and a falling edge of a clock training signal, and may be configured to transmit the modulated clock signal to the plurality of source drivers through the clock embedded data channels in a vertical training mode.

Accordingly, data and a clock signal can be transmitted at high speed with no skew.

BRIEF DESCRIPTION OF THE DRAWINGS

Illustrative, non-limiting example embodiments will be more clearly understood from the following detailed description taken in conjunction with the accompanying drawings.

FIGS. 6A through 6D are timing diagrams for describing examples of operations of clock code detecting unit and clock signal generating unit included in a clock recovery unit of FIG. 4.

FIG. 11 is a block diagram illustrating a delay circuit included in a clock recovery unit of FIG. 4.

FIG. 12 is a block diagram illustrating an output unit included in a clock recovery unit of FIG. 4.

DETAILED DESCRIPTION OF THE EMBODIMENTS

Figure 1:
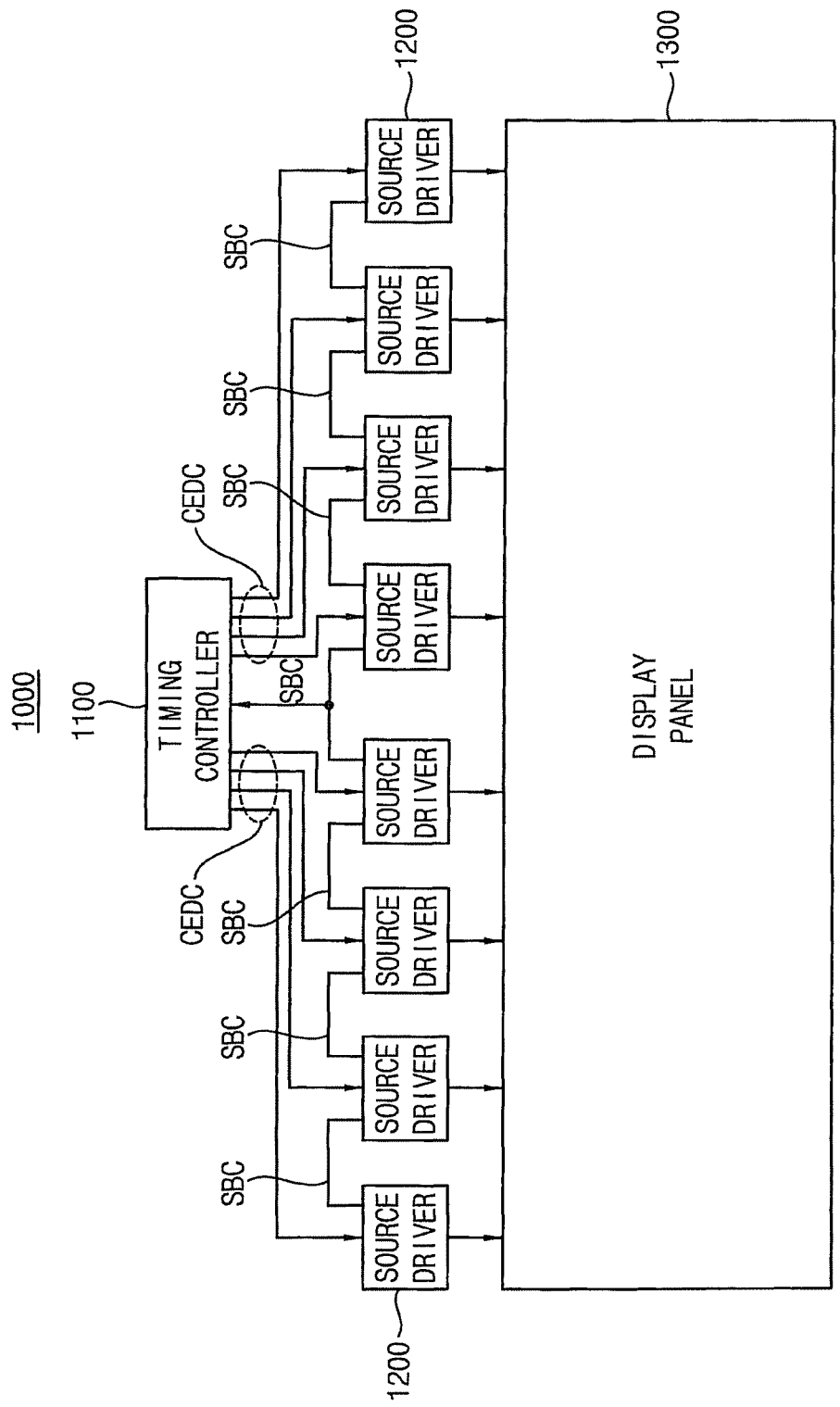
FIG. 1 is a block diagram illustrating a display device according to example embodiments.

Various example embodiments will be described more fully hereinafter with reference to the accompanying drawings, in which some example embodiments are shown. The present inventive concepts may, however, be embodied in many different forms and should not be construed as limited to the example embodiments set forth herein. Rather, these example embodiments are provided so that this disclosure will be thorough and complete, and will fully convey the scope of the present inventive concept to those skilled in the art. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element, component, region, layer or section discussed below could be termed a second element, component, region, layer or section without departing from example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present inventive concept. As used herein, the singular foams "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating a display device according to example embodiments.

Referring to FIG. 1, a display device 1000 includes a timing controller 1100, a plurality of source drivers 1200 and a display panel 1300.

The timing controller 1100 may transfer image data or control data through clock embedded data channels CEDC to the source drivers 1200. The timing controller 1100 may also transmit a clock signal embedded in the image data or the control data through the clock embedded data channels CEDC. In a training mode, the timing controller 1100 may transmit a clock training signal through the clock embedded data channels CEDC to the source drivers 1200, and thus a clock and data recovery (CDR) circuit included in each source driver 1200 may be locked based on the clock training signal. In a display data mode, the timing controller 1100 may transmit data bits and a clock code periodically inserted into the data bits through clock embedded data channels CEDC to the source drivers 1200. The clock code may be inserted into the data bits with a period the same as that of the clock training signal. The clock embedded data channels CEDC may be coupled between the timing controller 1100 and the source drivers 1200 in a point-to-point topology.

Each source driver 1200 may provide lock state information about whether the CDR circuit is locked or unlocked to the timing controller 1100 through a shared back channel SBC. For example, in the training mode, each source driver 1200 may inform the timing controller 1100 that the CDR included in the source driver 1200 is locked through the shared back channel SBC. In the display data mode, when some setting values are changed because of a soft fail due to electrostatic discharge (ESD), power fluctuation, etc., each source driver 1200 may inform the timing controller 1100 that the CDR included in the source driver 1200 is unlocked through the shared back channel SBC. The shared back channel SBC may be a single channel that is shared by the source drivers 1200. In some embodiments, as illustrated in FIG. 1, the shared back channel SBC may be coupled between the timing controller 1100 and the source drivers 1200 in a daisy chain topology. In other embodiments, the shared back channel SBC may be coupled between the timing controller 1100 and the source drivers 1200 in a multi-drop topology.

The display panel 1300 may be operated by the source driers 1200 to display an image. For example, the display panel 1300 may include a liquid crystal display panel, an organic light emitting display panel, a plasma display panel and/or etc. The display device 1000 may further include a gray scale voltage generator that provides gray scale voltages to the source drivers 1200 and gate drivers that select a row of pixels in the display panel 1300.

The display device 1000 according to some example embodiments may provide a clock signal as well as data to the source drivers 1200 without a dedicated clock line. Further, since the timing controller 1100 receives the lock state information from the source drivers 1200 through the shared back channel SBC, the display device 1000 may efficiently recover the soft fail.

Figure 2:
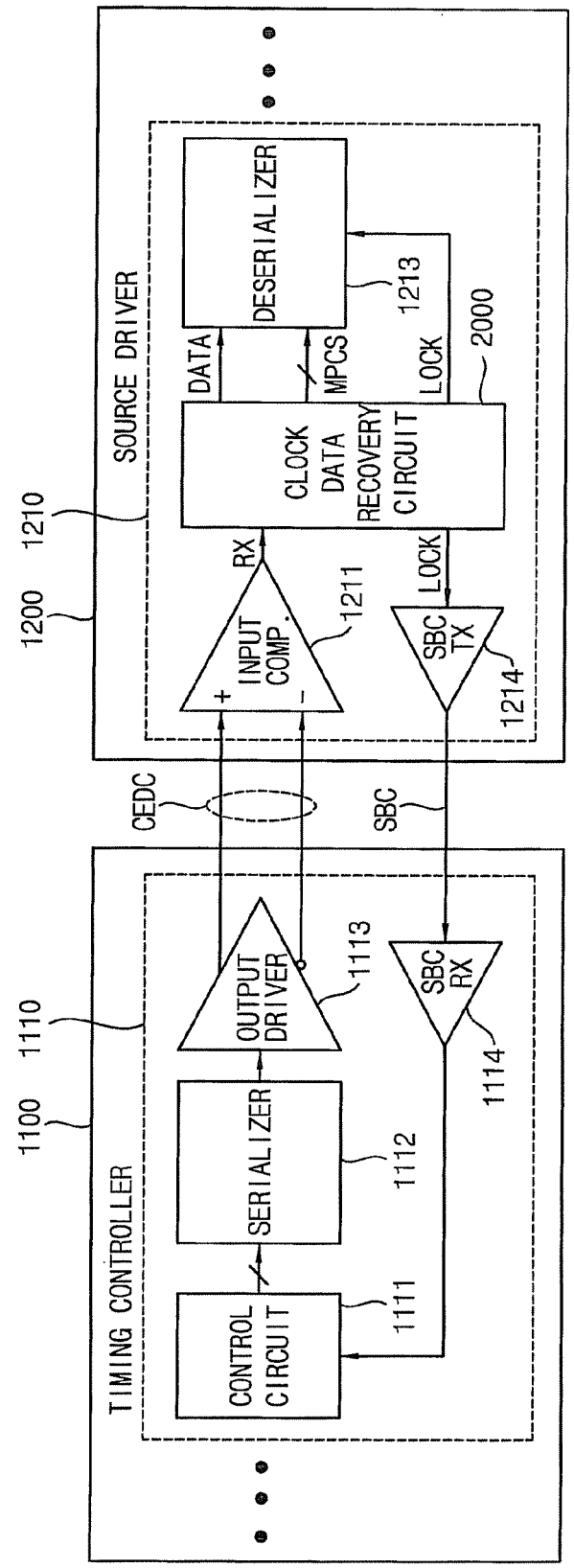
FIG. 2 is a block diagram illustrating a transmitting unit included in a timing controller illustrated in FIG. 1 and a receiving unit included in a source driver illustrated in FIG. 1.

FIG. 2 is a block diagram illustrating a transmitting unit included in a timing controller illustrated in FIG. 1 and a receiving unit included in a source driver illustrated in FIG. 1.

Referring to FIG. 2, a timing controller 1100 includes a transmitting unit 1110, and each source driver 1200 includes a receiving unit 1210. The transmitting unit 1110 may include a control circuit 1111, a serializer 1112, an output driver 1113 and a shared back channel receiver 1114. The receiving unit 1210 includes an input comparator 1211, a clock and data recovery (CDR) circuit 2000, a deserializer 1213 and a shared back channel transmitter 1214.

The transmitting unit 1110 may transfer a clock training signal to the source driver 1200 through a clock embedded data channel CEDC in a training mode, and may transfer clock-embedded data including data bits and a clock code to the source driver 1200 through the clock embedded data channel CEDC in a display data mode. The receiving unit 1210 may be locked based on the clock training signal in the training mode, and may recover data and a clock signal from the received clock-embedded data in the display data mode.

The control circuit 1111 may control the transmitting unit 1110, and may periodically insert the clock code into the data bits in the display data mode. For example, the control circuit 1111 may insert the clock code of two bits per twelve data bits. The serializer 1112 may serialize parallel data including the data bits and the clock code provided from the control circuit 1111. The output driver 1113 may transmit the serial data provided from the serializer 1112 to the source driver 1200 through the clock embedded data channel CEDC. The clock embedded data channel CEDC may be a differential signal line, and the serial data transmitted by the output driver 1113 may be a differential signal. The shared back channel receiver 1114 may receive lock state information from the source driver 1200 through a shared back channel SBC, and may provide the lock state information to the control circuit 1111. The control circuit 1111 may know whether the source driver 1200 is locked or unlocked based on the lock state information transferred through the shared back channel SBC. In some embodiments, the control circuit 1111 may start to transfer the data after all of the source drivers 1200 are locked.

The input comparator 1211 may receive the serial data including the data bits and the clock code through the clock embedded data channel CEDC. In some embodiments, the serial data may be a differential signal, and the input comparator 1211 may compare the differential signal to provide a received signal RX to the CDR circuit 2000. The CDR circuit 2000 may recover data DATA and a multi-phase clock signal MPCS from the received signal RX. The deserializer 1213 may generate parallel data by sampling the data DATA based on the multi-phase clock signal MPCS. The CDR circuit 2000 may provide the shared back channel transmitter 1214 with a lock signal LOCK indicating whether the CDR circuit 2000 is locked or unlocked. The shared back channel transmitter 1214 may transfer the lock state information to the timing controller 1100 based on the lock signal LOCK provided from the CDR circuit 2000.

Each source driver 1200 may further include a data latch unit and a data conversion unit. The data latch unit may include a resister that stores the parallel data provided from the deserializer 1213. When data corresponding to a row of pixels are stored in the data latch unit, the data latch unit may provide the stored data to the data conversion unit. The data conversion unit may generate analog signals by selecting gray scale voltages based on the data provided from the data latch unit, and may apply the analog signals to the display panel 1300 illustrated in FIG. 1.

Figure 3:
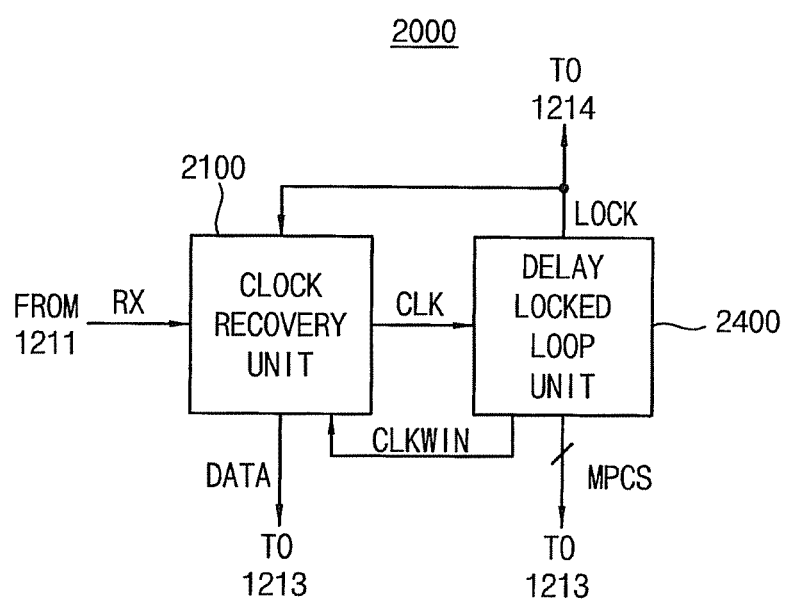
FIG. 3 is a block diagram illustrating a clock and data recovery (CDR) circuit included in a source driver.

FIG. 3 is a block diagram illustrating a clock and data recovery (CDR) circuit included in a source driver.

Referring to FIG. 3, a CDR circuit 2000 includes a clock recovery unit 2100 and a delay locked loop unit 2400.

The clock recovery unit 2100 may receive a signal RX from a timing controller through an input comparator 1211. The clock recovery circuit 2100 may recover a clock signal CLK from the received signal RX in response to a clock window signal CLKWIN provided from the delay locked loop unit 2400. The clock recovery unit 2100 may provide the received signal RX as data DATA to a deserializer 1213, and may provide the clock signal CLK to the delay locked loop unit 2400.

The delay locked loop unit 2400 may generate a multi-phase clock signal MPCS based on the clock signal CLK provided from the clock recovery unit 2100. The delay locked loop unit 2400 may provide the multi-phase clock signal MPCS to the deserializer 1213. The delay locked loop unit 2400 may provide the clock recovery unit 2100 and a shared back channel transmitter 1214 with a lock signal LOCK that indicates whether the delay locked loop unit 2400 is locked or unlocked.

Figure 4:
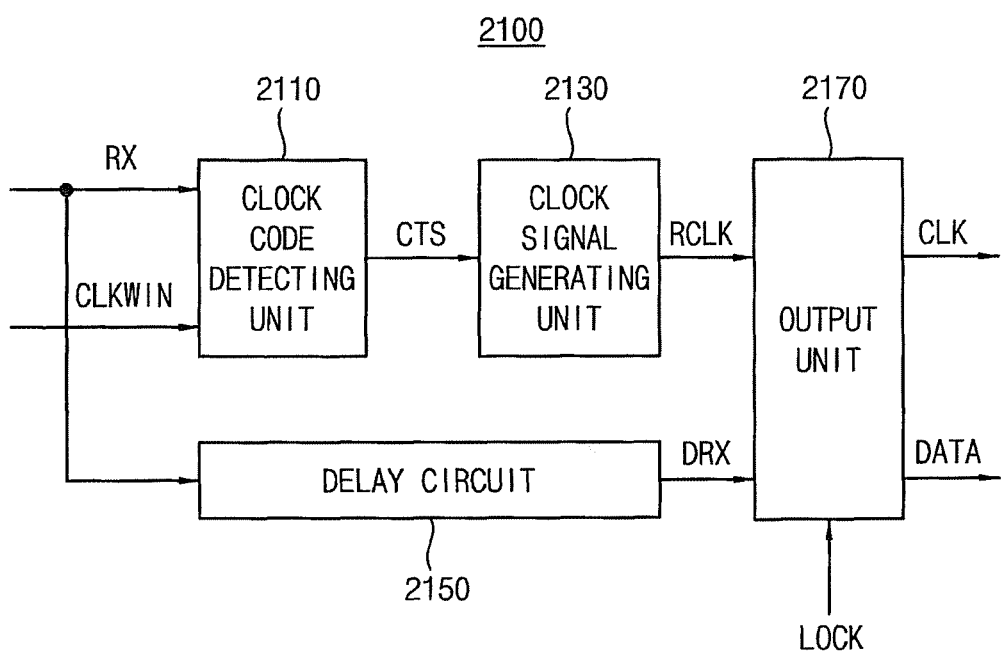
FIG. 4 is a block diagram illustrating a clock recovery unit included in a CDR circuit of FIG. 3.

FIG. 4 is a block diagram illustrating a clock recovery unit included in a CDR circuit of FIG. 3.

Referring to FIG. 4, a clock recovery unit 2100 includes a clock code detecting unit 2110, a clock signal generating unit 2130, a delay circuit 2150 and an output unit 2170.

The clock code detecting unit 2110 may receive a signal RX including data bits and a clock code. The clock code of one or two bits may be periodically inserted into every N data bits, where N is an integer more than 1. For example, the clock code of two bits may be inserted per twelve data bits. The clock code may have a level opposite to that of an adjacent data bit. For example, the clock code may have a logic low level if the adjacent data bit has a logic high level, and the clock code may have a logic high level if the adjacent data bit has a logic low level. Since the clock code has the level opposite to that of the adjacent data bit, the clock code may have a rising edge or a falling edge between the clock code and the adjacent data bit. In some embodiments, the clock code may have a level opposite to that of a previous data bit. In other embodiments, the clock code may have a level opposite to that of a next data bit.

The clock code detecting unit 2110 may detect an edge of the clock code from the received signal RX in response to a clock window signal CLKWIN. The clock window signal CLKWIN received from a delay locked loop unit 2400 illustrated in FIG. 3 may have a logic high level while the clock code transitions from high to low or from low to high. The clock code detecting unit 2110 may detect the edge from the received signal RX when the clock window signal CLKWIN has the logic high level. The clock code detecting unit 2110 may generate a clock transition signal CTS based on the detected edge. The clock transition signal CTS may have a rising edge when the clock code transitions.

The clock signal generating unit 2130 may generate a recovered clock signal RCLK in response to the clock transition signal CTS. The recovered clock signal RCLK may periodically transition in response to the clock transition signal CTS. A period of the recovered clock signal RCLK may be the same as that of the clock transition signal CTS.

The clock signal generating unit 2130 may control the recovered clock signal RCLK to transition from a logic low level to a logic high level in response to the clock transition signal CTS rising from a logic low level to a logic high level. In some embodiments, the clock signal generating unit 2130 may delay the clock transition signal CTS, and may control the recovered clock signal RCLK to transition from a logic high level to a logic low level in response to the delayed clock transition signal. In other embodiments, the clock signal generating unit 2130 may receive a clock falling signal from a delay locked loop unit 2400 illustrated in FIG. 3, and may control the recovered clock signal RCLK to transition from a logic high level to a logic low level in response to the clock falling signal.

The delay circuit 2150 may delay the received signal RX by a delay time of the clock code detecting unit 2110 and the clock signal generating unit 2130. The data bits and the clock code may be delayed by the delay circuit 2150 in a display data mode, and a clock training signal may be delayed by the delay circuit 2150 in a training mode.

The output unit 2170 may output a clock signal CLK and/or data DATA based on the recovered clock signal RCLK provided from the clock signal generating unit. 2130 and a delayed received signal DRX provided from the delay circuit 2150. In the training mode, the output unit 2170 may output as the clock signal CLK the delayed received signal DRX, which is the clock training signal delayed by the delay circuit 2150. In the display data mode, the output unit 2170 may output the recovered clock signal RCLK as the clock signal CLK, and may output the delayed received signal DRX as the data DATA.

If the received signal RX is not encoded with a code, such as an 8B/10B code, the clock recovery unit 2100 may not perform a decoding operation. Further, the clock recovery unit 2100 may accurately and efficiently recover a clock signal by detecting an edge of a clock code using a clock window signal CLKWIN.

Figure 5:
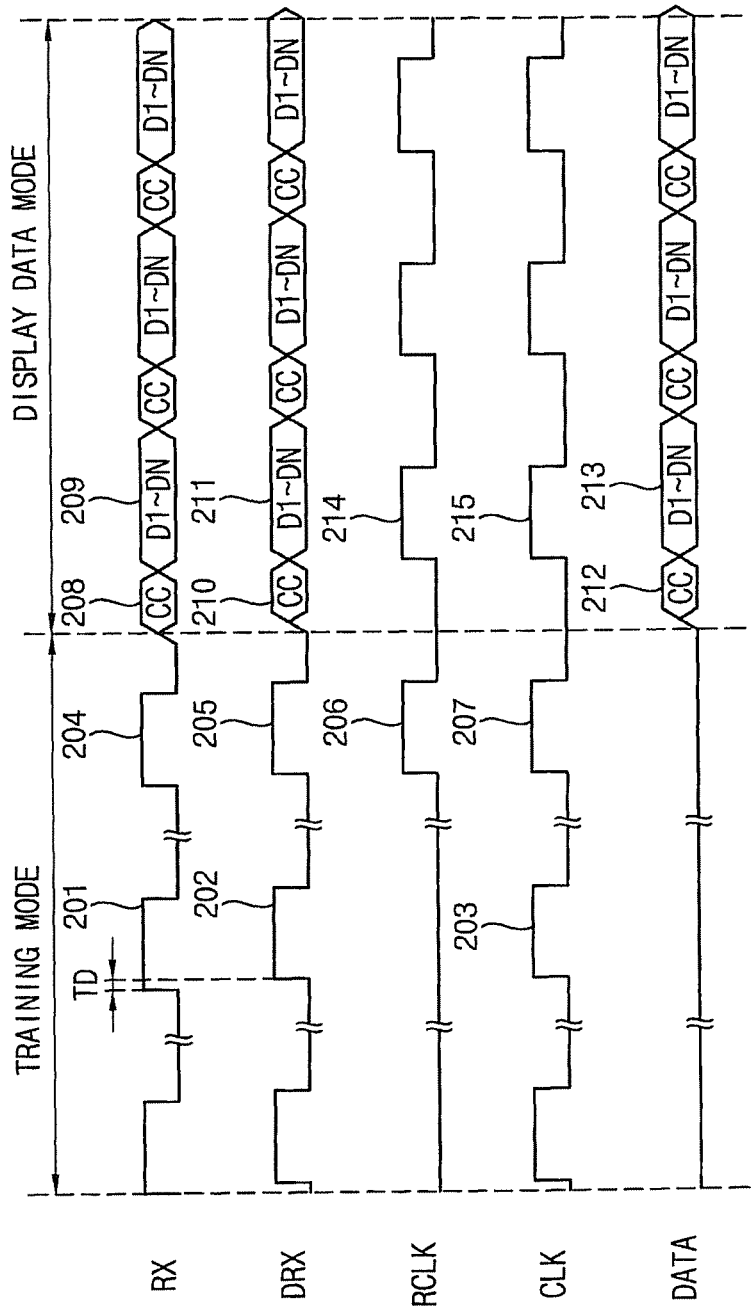
FIG. 5 is a timing diagram for describing an operation of a clock recovery unit of FIG. 4.

FIG. 5 is a timing diagram for describing an operation of a clock recovery unit of FIG. 4.

Referring to FIGS. 4 and 5, in a training mode, a delay circuit 2150 may delay a clock training signal as a received signal RX by a delay time TD and provide the delayed received signal DRX to an output unit 2170. The delay time TD may be the same as a delay time of a clock code detecting unit 2110 and a clock signal generating unit 2130. The output unit 2170 may output the delayed received signal DRX as a clock signal CLK in the training mode. For example, a pulse 202 of the delayed received signal DRX may be delayed by the delay time TD with respect to a pulse 201 of the clock training signal, and may be output as a pulse 203 of the clock signal CLK.

After a delay locked loop unit 2400 illustrated in FIG. 3 is locked in the training mode, the clock code detecting unit 2110 and the clock signal generating unit 2130 may generate a recovered clock signal RCLK by detecting an edge of the received signal RX. For example, the clock code detecting unit 2110 and the clock signal generating unit 2130 may detect a rising edge of a pulse 240 of the clock training signal, and may generate a pulse 206 of the recovered clock signal RCLK based on the detected edge. The output unit 2170 may output a pulse 205 of the delayed received signal DRX or the pulse 206 of the recovered clock signal RCLK as a pulse 207 of the clock signal CLK.

In a display data mode, the received signal RX includes data bits 209 and a clock code 208 periodically inserted into the data bits 209. The delay circuit 2150 may delay the received signal RX by the delay time TD, and output the delayed received signal DRX. The output unit 2170 may output the delayed received signal DRX as data DATA. For example, data bits 211 and a clock code 211 delayed with respected to the data bits 209 and the clock code 208 may be output as the data DATA. The data bits 211 of the data DATA may be sampled by a deserializer 1213 illustrated in FIG. 2.

In the display data mode, the clock code detecting unit 2110 and the clock signal generating unit 2130 may generate the recovered clock signal RCLK by detecting an edge of the clock code 208, and the output unit 2170 may output the recovered clock signal RCLK as the clock signal CLK. For example, the clock code detecting unit 2110 may generate a clock transition signal CTS by detecting an edge between the clock code 208 and the data bits 209, the clock signal generating unit 2130 may generate a pulse 214 of the recovered clock signal RCLK in response to the clock transition signal CTS, and the output unit 2170 may output the pulse 214 of the recovered clock signal RCLK as a pulse 215 of the clock signal CLK.

Figure 6A:
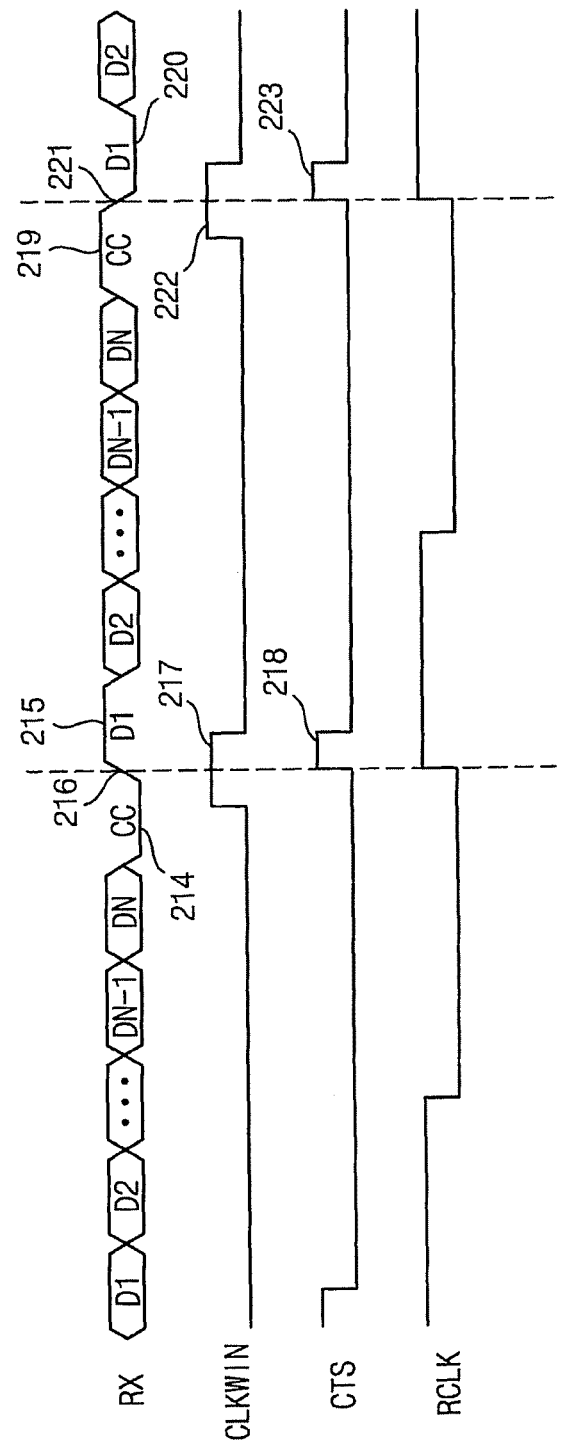

FIG. 6A is a timing diagram for describing an example of operations of clock code detecting unit and clock signal generating unit included in a clock recovery unit of FIG. 4.

Referring to FIGS. 4 and 6A, each clock code 214 and 219 included in a received signal RX has a length of one bit, and has a level opposite to that of a next data bit 215 and 221. For example, a clock code 214 has a logic low level opposite to a logic high level of a next data bit 215, and a clock code 219 has a logic high level opposite to a logic high level of a next data bit 219. Accordingly, each clock code 214 and 219 may have an edge 216 and 221 between the clock code 214 and the next data bit 215 and between *the clock code 219 and the next data bit 220, respectively. For example, the clock code 214 may have a rising edge 216, and the clock code 219 may have a falling edge 221.

A clock window signal CLKWIN may have a logic high level from a time point of each clock code 214 and 215 to a time point of the next data bit 219 and 220. A clock code detecting unit 2110 may detect an edge of the received signal RX while the clock window signal CLKWIN has the logic high level. Accordingly, the clock code detecting unit 2110 may detect the edge of the clock code 214 and 219. For example, the clock code detecting unit 2110 may detect the rising edge 216 of the clock code 214 in response to a pulse 217 of the clock window signal CLKWIN, and may detect the falling edge 221 of the clock code 219 in response to a pulse 222 of the clock window signal CLKWIN. Based on the detection, the clock code detecting unit 2110 may generate a clock transition signal CTS that transitions from low to high at the edge 216 and 221 of each clock code 214 and 219.

A clock signal generating unit 2130 may generate a recovered clock signal RCLK in response to the clock transition signal CTS. The recovered clock signal RCLK may have a periodical rising edge in response to each pulse 218 and 223 of the clock transition signal CTS.

FIG. 6B is a timing diagram for describing another example of operations of clock code detecting unit and clock signal generating unit included in a clock recovery unit of FIG. 4.

Referring to FIGS. 4 and 6B, each clock code 224 included in a received signal RX has a length of one bit, and has a level opposite to that of a previous data bit 225. For example, a clock code 224 has a logic low level opposite to a logic high level of a previous data bit 225, and may have a falling edge 226 between the clock code 224 and the previous data bit 225. A clock code detecting unit 2110 may detect the falling edge 226 of the clock code 224 in response to a pulse 227 of a clock window signal CLKWIN having a logic high level from a time point of the previous data bit 225 to a time point of the clock code 224, and may generate a clock transition signal CTS that transitions from low to high at the edge 226 of the clock code 224. A clock signal generating unit 2130 may generate a recovered clock signal RCLK that transitions form low to high in response to a pulse 228 of the clock transition signal CTS.

Figure 6C:
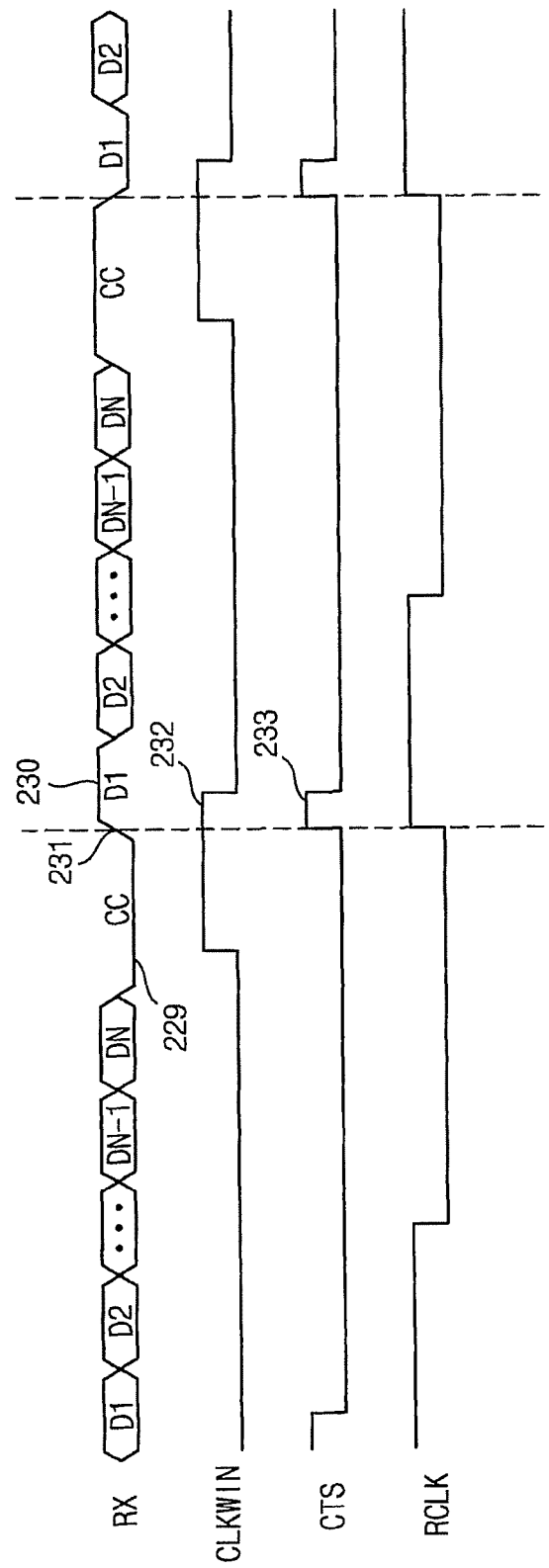

FIG. 6C is a timing diagram for describing still another example of operations of clock code detecting unit and clock signal generating unit included in a clock recovery unit of FIG. 4.

Referring to FIGS. 4 and 6C, each clock code 229 included in a received signal RX has a length of two bits, and has a level opposite to that of a next data bit 230. For example, a clock code 229 has a logic low level opposite to a logic high level of a next data bit 230, and may have a rising edge 231 between the clock code 229 and the next data bit 230. A clock code detecting unit 2110 may detect the rising edge 231 of the clock code 229 in response to a pulse 232 of a clock window signal CLKWIN having a logic high level from a time point of the clock code 229 to a time point of the next data bit 230, and may generate a clock transition signal CTS that transitions from low to high at the edge 231 of the clock code 229. A clock signal generating unit 2130 may generate a recovered clock signal RCLK that transitions from low to high in response to a pulse 233 of the clock transition signal CTS.

Figure 6D:
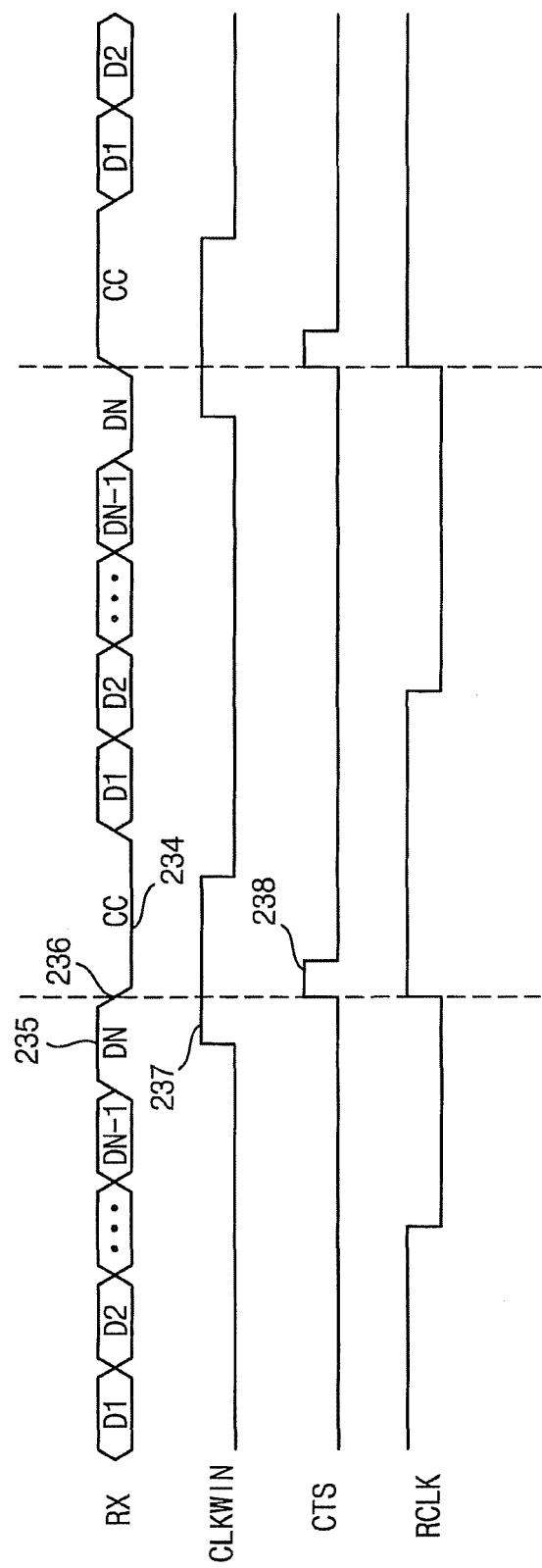

FIG. 6D is a timing diagram for describing still another example of operations of clock code detecting unit and clock signal generating unit included in a clock recovery unit of FIG. 4.

Referring to FIGS. 4 and 6D, each clock code 234 included in a received signal RX has a length of two bits, and has a level opposite to that of a previous data bit 235. For example, a clock code 234 has a logic low level opposite to a logic high level of a previous data bit 235, and may have a falling edge 236 between the clock code 234 and the previous data bit 235. A clock code detecting unit 2110 may detect the falling edge 236 of the clock code 234 in response to a pulse 237 of a clock window signal CLKWIN having a logic high level from a time point of the previous data bit 235 to a time point of a second bit of the clock code 234, and may generate a clock transition signal CTS that transitions from low to high at the edge 236 of the clock code 234. A clock signal generating unit 2130 may generate a recovered clock signal RCLK that transitions from low to high in response to a pulse 238 of the clock transition signal CTS.

As illustrated in FIGS. 6A through 6D, each clock code may have a length of one or more bits, and may have an edge between the clock code and a previous or next data bit. Although FIGS. 6A through 6D illustrate a recovered clock signal RCLK that is not delayed for the sake of simplicity, the recovered clock signal RCLK may be delayed with respect to an edge of a clock code by a clock code detecting unit and a clock signal generating unit. As described below with reference to FIGS. 20 through 21B, a clock recovery unit 2100 may use a clock window signal that is adaptively selected according to a transmission rate and/or a delay time, thereby accurately detecting the edge of the clock code.

Figure 7:
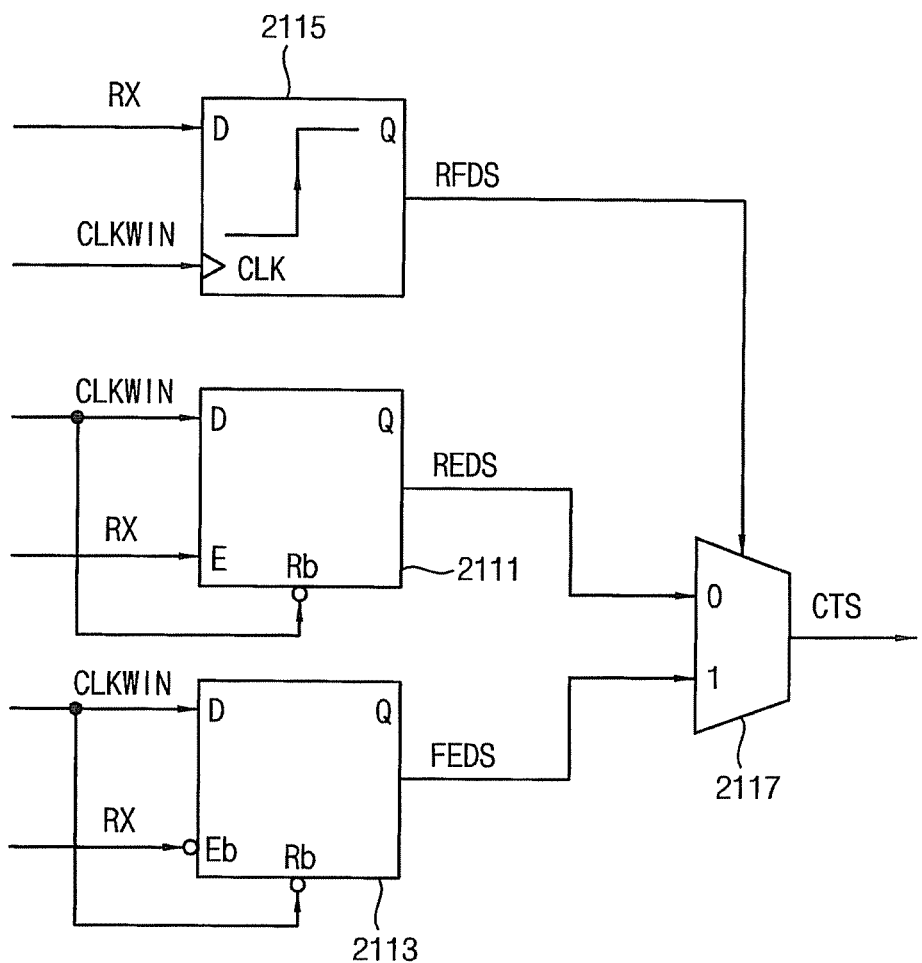
FIG. 7 is a block diagram illustrating a clock code detecting unit included in a clock recovery unit of FIG. 4.

FIG. 7 is a block diagram illustrating a clock code detecting unit included in a clock recovery unit of FIG. 4.

Referring to FIG. 7, a clock code detecting unit 2110 includes a rising detector 2111, a falling detector 2113, a rise-fall determiner 2115 and a selector 2117.

The rising detector 2111 may generate a rising edge detection signal REDS by detecting a rising edge of a clock code included in a received signal RX in response to a clock window signal CLKWIN. The falling detector 2113 may generate a falling edge detection signal FEDS by detecting a falling edge of a clock code included in the received signal RX in response to a clock window signal CLKWIN. If a clock code has a rising edge, the rising edge detection signal REDS may be activated based on the rising edge of the clock code. If a clock code has a falling edge, the falling edge detection signal FEDS may be activated based on the falling edge of the clock code.

The rising detector 2111 may be implemented with a first gated latch, which has a data terminal that receives a clock window signal CLKWIN, an enable terminal that receives the received signal RX, an inversion reset terminal that receives the clock window signal CLKWIN, and an output terminal that outputs the rising edge detection signal REDS. The rising detector 2111 may be reset when the clock window signal CLKWIN has a logic low level. If the clock window signal CLKWIN has a logic high level, the rising detector 2111 may output the clock window signal CLKWIN when the received signal RX has a logic high level, and may maintain a previous output when the received signal RX has a logic low level.

The falling detector 2113 may be implemented with a second gated latch, which has a data terminal that receives the clock window signal CLKWIN, an inversion enable terminal that receives the received signal RX, an inversion reset terminal that receives the clock window signal CLKWIN, and an output terminal that outputs the falling edge detection signal FEDS. The falling detector 2113 may be reset when the clock window signal CLKWIN has a logic low level. If the clock window signal CLKWIN has a logic high level, the falling detector 2113 may output the clock window signal CLKWIN when the received signal RX has a logic low level, and may maintain a previous output when the received signal RX has a logic high level.

The rise-fall determiner 2115 may generate a rise-fall decision signal RFDS by determining whether the clock code included in the received signal RX has a falling edge or a rising edge based on the clock window signal CLKWIN. For example, the rise-fall determiner 2115 may generate the rise-fall decision signal RFDS of a logic low level when the clock code has the rising edge, and may generate the rise-fall decision signal RFDS of a logic high level when the clock code has the falling edge.

The rise-fall determiner 2115 may be implemented with a rising edge triggered flip-flop, which has a data terminal that receives the received signal RX, a clock terminal that receives the clock window signal CLKWIN, and an output terminal that outputs the rise-fall decision signal RFDS. The rise-fall determiner 2115 may output the received signal RX as the rise-fall decision signal RFDS in response to a rising edge of the clock window signal CLKWIN.

The selector 2117 may selectively output the rising edge detection signal REDS provided from the rising detector 2111 or the falling edge detection signal FEDS provided from the falling detector 2113 in response to the rise-fall decision signal RFDS provide from the rise-fall determiner 2115.

The selector 2117 may be implemented with a multiplexer, which has a first input terminal that receives the rising edge detection signal REDS, a second input terminal that receives the falling edge detection signal FEDS, a selection terminal that receives the rise-fall decision signal RFDS, and an output terminal that outputs a clock transition signal CTS. For example, the selector 2117 may output the rising edge detection signal REDS as the clock transition signal CTS when the rise-fall decision signal RFDS has a logic low level, and may output the falling edge detection signal FEDS as the clock transition signal CTS when the rise-fall decision signal RFDS has a logic high level.

The clock code detecting unit 2110 may detect an edge of the clock code regardless of whether the clock code has a rising edge or a falling edge.

Figure 8:
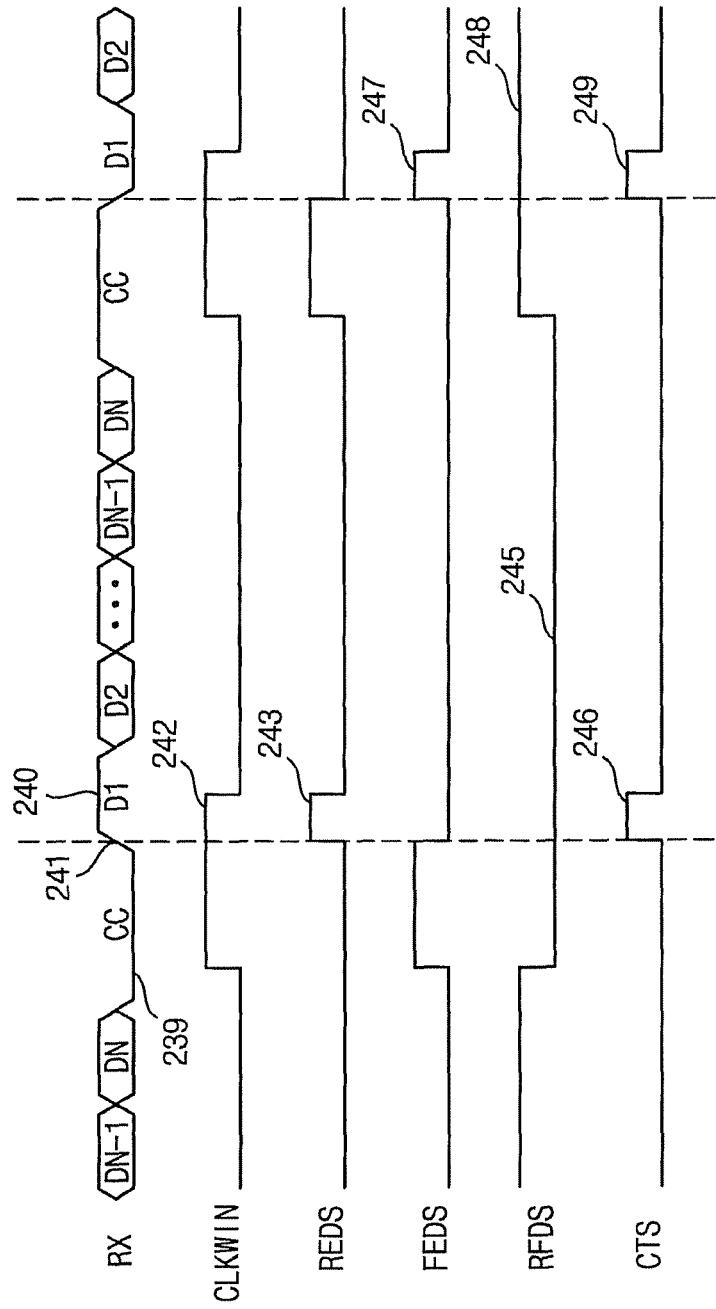
FIG. 8 is a timing diagram for describing an operation of a clock code detecting unit of FIG. 7.

FIG. 8 is a timing diagram for describing an operation of a clock code detecting unit of FIG. 7.

Referring to FIGS. 7 and 8, while a clock code 239 of a logic low level is applied to an enable terminal of a rising detector 2111, the rising detector 2111 may maintain a previous output. The rising detector 2111 may output a rising edge detection signal REDS of a logic low level while the clock code 239 has the logic low level. If a data bit 240 of a logic high level is applied to the enable terminal of the rising detector 2111, the rising detector 2111 may output a clock window signal CLKWIN of a logic high level as the rising edge detection signal REDS. If the clock window signal CLKWIN transitions from the logic high level to a logic low level, the rising detector 2111 may be reset, and then may output the rising edge detection signal REDS of a logic low level. Thus, the rising detector 2111 may generate the rising edge detection signal REDS having a pulse 243 transitioning from low to high in response to a rising edge of the clock code 239. Similarly, a falling detector 2113 may a falling edge detection signal FEDS having a pulse 247 transitioning from low to high in response to a falling edge of a clock code.

A rise-fall determiner 2115 may output a received signal RX as a rise-fall decision signal RFDS in response to a rising edge of the clock window signal CLKWIN. For example, the rise-fall determiner 2115 may output the rise-fall decision signal RFDS of a logic low level 245 by latching the clock code 239 of a logic low level in response to a rising edge of a pulse 242 of the clock window signal CLKWIN.

A selector 2117 may selectively output the rising edge detection signal REDS or the falling edge detection signal FEDS as a clock transition signal CTS in response to the rise-fall decision signal RFDS. For example, the selector 2117 may output the rising edge detection signal REDS as clock transition signal CTS when the rise-fall decision signal RFDS has the logic low level 245, and may output the falling edge detection signal FEDS as the clock transition signal CTS when the rise-fall decision signal RFDS has a logic high level 248. Accordingly, the clock transition signal CTS may have pulses 246 and 249 that transitions from low to high at edges of clock codes.

Figure 9:
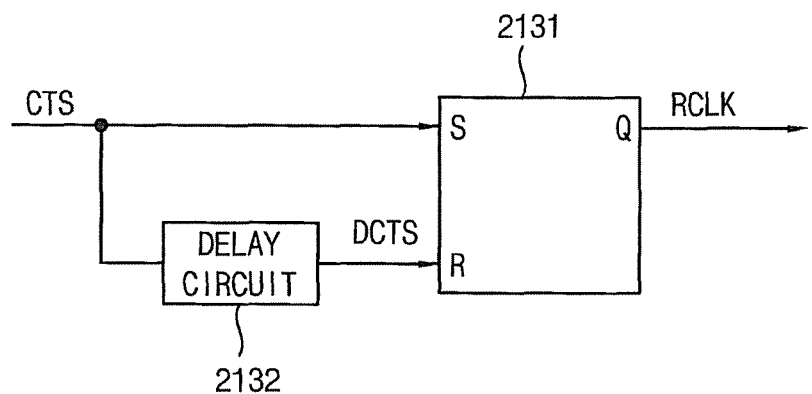
FIG. 9 is a block diagram illustrating an example of a clock signal generating unit included in a clock recovery unit of FIG. 4.

FIG. 9 is a block diagram illustrating an example of a clock signal generating unit included in a clock recovery unit of FIG. 4.

Referring to FIG. 9, a clock signal generating unit 2130 includes a set-reset (SR) latch 2131 and a delay circuit 2132.

The delay circuit 2132 generates a delayed clock transition signal DCTS by delaying a clock transition signal CTS. The delayed clock transition signal DCTS may have a pulse delayed with respect to a pulse of the clock transition signal CTS.

The SR latch 2131 may have a set terminal that receives the clock transition signal CTS, a reset terminal that receives the delayed clock transition signal DCTS, and an output terminal that outputs a recovered clock signal RCLK. The SR latch 2131 may output the recovered clock signal RCLK of a logic high level when the clock transition signal CTS has a logic high level, and may output the recovered clock signal RCLK of a logic low level when the delayed clock transition signal DCTS has a logic high level. The SR latch 2131 may maintain a previous output when both of the clock transition signal CTS and the delayed clock transition signal DCTS have logic low levels. Thus, the recovered clock signal RCLK may transition from low to high when the clock transition signal CTS transitions from low to high, and may transition from high to low when the delayed clock transition signal DCTS transitions from low to high.

Figure 10:
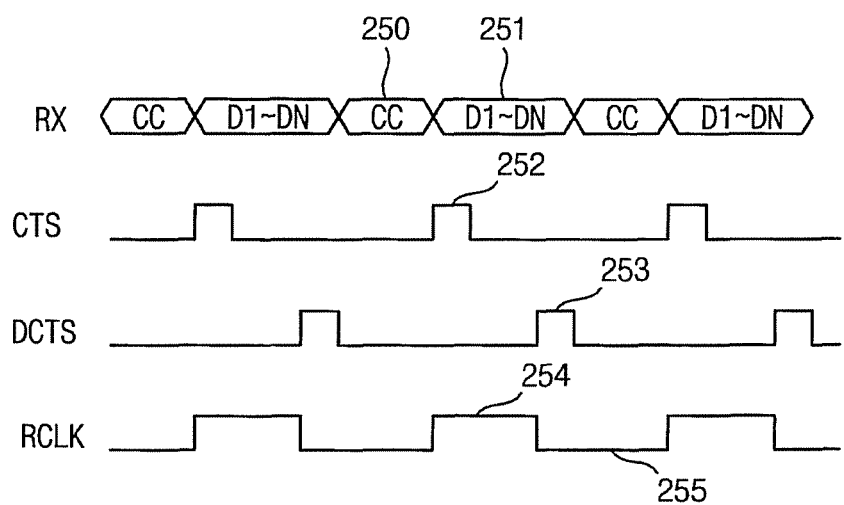
FIG. 10 is a timing diagram for describing an operation of a clock signal generating unit of FIG. 9.

FIG. 10 is a timing diagram for describing an operation of a clock signal generating unit of FIG. 9.

Referring to FIGS. 9 and 10, a clock signal generating unit 2130 may generate a recovered clock signal RCLK that transitions from a logic low level to a logic high level 254 in response to a rising edge of a pulse 252 of a clock transition signal CTS. The recovered clock signal RCLK transitions from the logic high level 254 to a logic low level 255 in response to a rising edge of a pulse 253 of a delayed clock transition signal DCTS. Accordingly, the clock signal generating unit 2130 may generate the recovered clock signal RCLK that periodically transitions from low to high at an edge of each clock code 250.

FIG. 11 is a block diagram illustrating a delay circuit included in a clock recovery unit of FIG. 4.

Referring to FIG. 11, a delay circuit 2150 includes a detector replica delay unit 2151, a selector replica delay unit 2153 and a latch replica delay unit 2155.

The detector replica delay unit 2151 may delay a received signal RX by a delay time of a rising detector 2111 or a falling detector 2113 illustrated in FIG. 7. The selector replica delay unit 2153 may further delay the received signal RX by a delay time of a selector 2117 illustrated in FIG. 7. The latch replica delay unit 2155 may still further delay the received signal RX by a delay time of an SR latch 2131 illustrated in FIG. 9. Thus, the delay circuit 2150 may delay the received signal RX by a delay time of a clock code detecting unit 2110 and a clock signal generating unit 2130 illustrated in FIG. 4. Accordingly, a clock recovery unit 2100 may output a clock signal CLK and data DATA that are delayed by the same delay time.

FIG. 12 is a block diagram illustrating an output unit included in a clock recovery unit of FIG. 4.

Referring to FIG. 12, an output unit 2170 includes a clock output unit 2171 and a data output unit 2173.

The clock output unit 2171 may selectively output a recovered clock signal RCLK or a delayed received signal DRX as a clock signal CLK. The clock output unit 2171 may output the delayed received signal DRX as the clock signal CLK in a training mode, and may output the recovered clock signal RCLK as the clock signal CLK in a display data mode.

The clock output unit 2171 may be implemented with a multiplexer, which has a first input terminal that receives the recovered clock signal RCLK, a second input terminal that receives the delayed received signal DRX, a selection terminal that receives an inversion lock signal /LOCK, and an output terminal that outputs the clock signal CLK. The inversion lock signal /LOCK may be an inversion signal of a lock signal LOCK, and may be provided from a delay locked loop unit 2400 illustrated in FIG. 3. The lock signal LOCK may have a logic high level and the inversion lock signal /LOCK may a logic low level while the delay locked loop unit 2400 illustrated in FIG. 3 is locked. Accordingly, the clock output unit 2171 may output the delayed received signal DRX as the clock signal CLK until the delay locked loop unit 2400 illustrated in FIG. 3 is locked, and may output the recovered clock signal RCLK after the delay locked loop unit 2400 illustrated in FIG. 3 is locked.

The data output unit 2173 may selectively output the delayed received signal DRX as data DATA. The data output unit 2173 may not output the data DATA in the training mode, and may output the delayed received signal DRX as the data DATA in the display data mode.

The data output unit 2173 may be implemented with a transmission gate controlled by the lock signal LOCK and the inversion lock signal /LOCK. The data output unit 2173 may output the delayed received signal DRX when the lock signal LOCK has a logic high level and the inversion lock signal /LOCK has a logic low level. Accordingly, the data output unit 2173 may output the data DATA in the display data mode.

Figure 13:
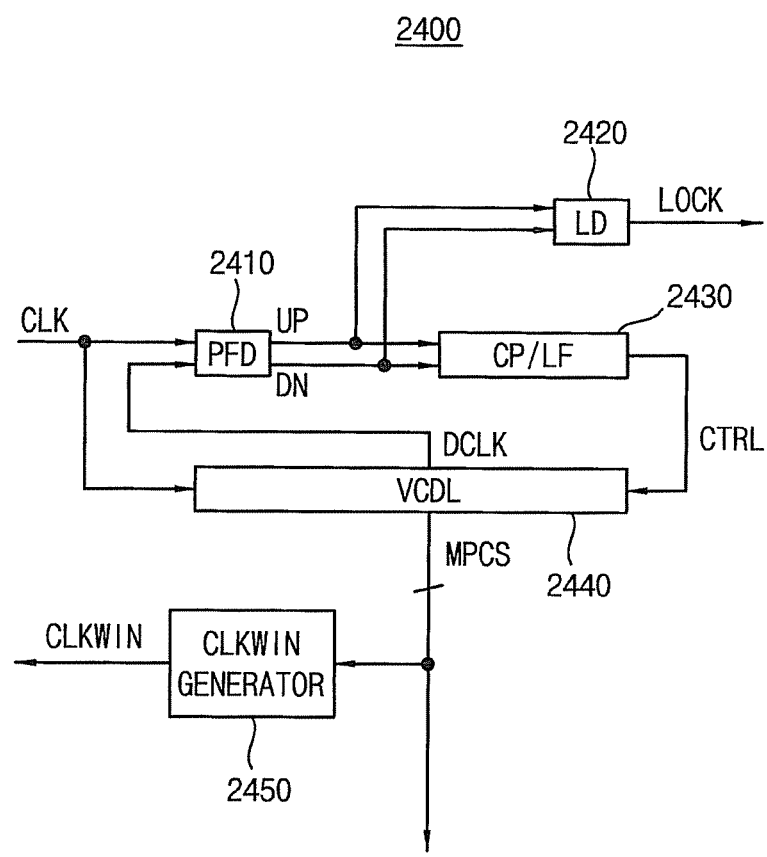
FIG. 13 is a block diagram illustrating a delay locked loop unit included in a CDR circuit of FIG. 3.

FIG. 13 is a block diagram illustrating a delay locked loop unit included in a CDR circuit of FIG. 3.

Referring to FIG. 13, a delay locked loop unit 2400 includes a phase-frequency detector 2410, a lock detector 2420, a control signal generator 2430, a delay line 2440 and a clock window generator 2450.

The phase-frequency detector 2410 detects a phase difference between a clock signal CLK provided from a clock recovery unit 2100 illustrated in FIG. 4 and a delayed clock signal DCLK provided from the delay line 2440. The phase-frequency detector 2410 may generate an up signal UP and a down signal DN based on the detected phase difference between the clock signal CLK and the delayed clock signal DCLK.

The control signal generator 2430 generates a delay control signal CTRL in response to the up signal UP and the down signal DN provided from the phase-frequency detector 2410. The control signal generator 2430 may include a charge pump that generates a charging current in response to the up signal UP and generates a discharging current in response to the down signal DN, and a loop filter that generate the delay control signal CTRL corresponding to the detected phase difference based on the charging current and the discharging current.

For example, if the delayed clock signal lags the clock signal CLK, the phase-frequency detector 2410 may generate the up signal UP of a logic high level, the control signal generator 2430 may decrease a delay time of the delay line 2440 in response to the up signal UP. If the delayed clock signal leads the clock signal CLK, the phase-frequency detector 2410 may generate the down signal DN of a logic high level, the control signal generator 2430 may increase the delay time of the delay line 2440 in response to down signal DN.

The lock detector 2420 may generate a lock signal LOCK indicating whether the delay locked loop unit 2400 is locked or unlocked based on the up signal UP and the down signal DN. For example, the lock detector 2420 may generate the lock signal LOCK of a logic high level when a period when the up signal UP has a logic high level is substantially the same as a period when the down signal DN has a logic high level.

The delay line 2440 generates the delayed clock signal DCLK by delaying the clock signal CLK. The delay line 2440 may include a plurality of delay cells that sequentially delay the clock signal CLK. The delay line 2440 may output a multi-phase clock signal MPCS including a plurality of clock signals that are respectively output from the plurality of delay cells. The delay line 2440 may provide the multi-phase clock signal MPCS to the clock window generator 2450 and a deserializer 1213 illustrated in FIG. 2.

The clock window generator 2450 generates a clock window signal CLKWIN based on the multi-phase clock signal MPCS provided from the delay line 2440. The clock window generator 2450 may perform a logical operation on the multi-phase clock signal MPCS to generate the clock window signal CLKWIN. In some embodiments, the clock window generator 2450 may adaptively generate the clock window signal CLKWIN according to a transmission rate of the received signal RX and/or a delay time of the clock recovery unit 2100 of FIG. 4. Although the clock window generator 2450 is illustrated in FIG. 13 as included in the delay locked loop unit 2400, a portion or the entire clock window generator 2450 may be located outside of the clock window generator 2450 or may be included in the clock recovery unit 2100 of FIG. 4.

Figure 14:
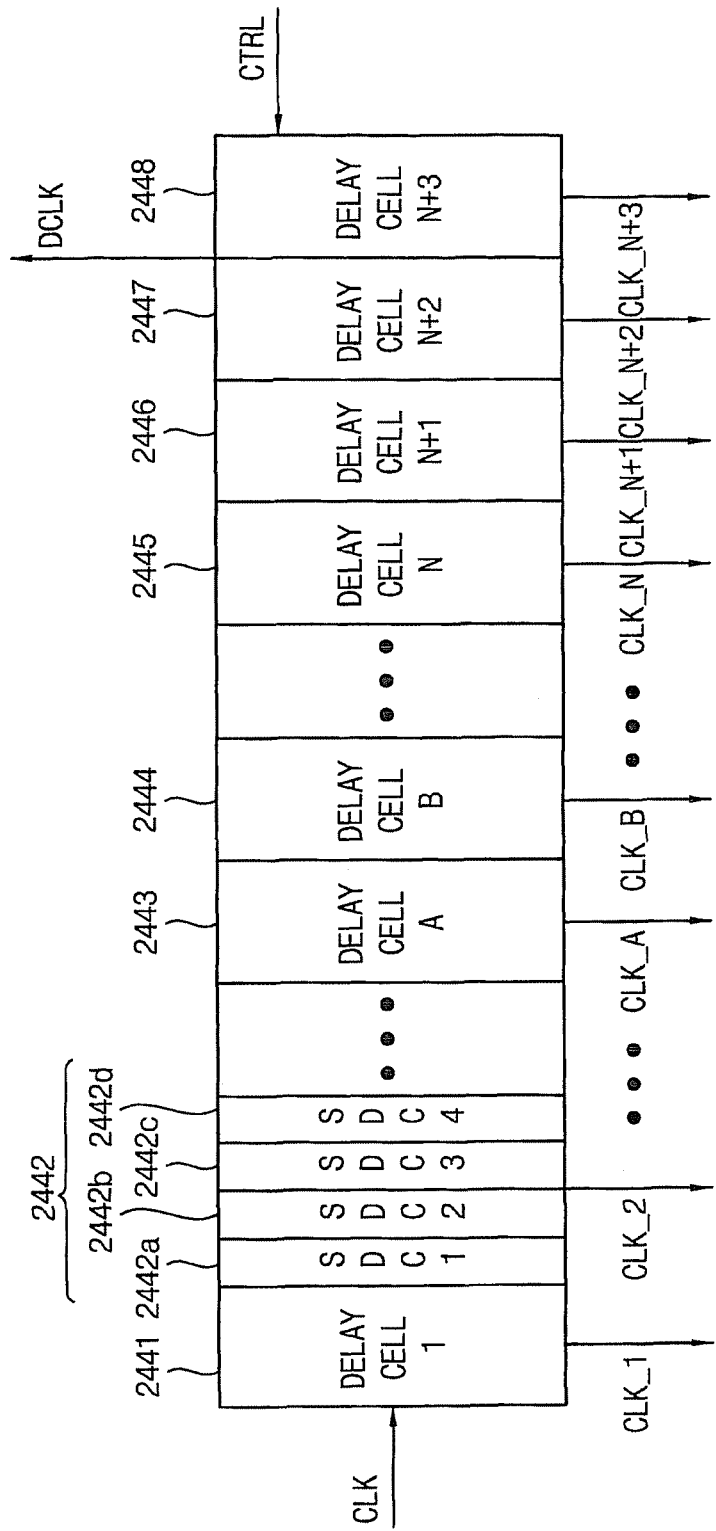
FIG. 14 is a block diagram illustrating a delay line included in a delay locked loop unit of FIG. 13.

FIG. 14 is a block diagram illustrating a delay line included in a delay locked loop unit of FIG. 13.

Referring to FIG. 14, a delay line 2440 includes first through N+3-th delay cells 2441 through 2448.

The first through N+3-th delay cells 2441 through 2448 may output first through N+3-th clock signals CLK_through CLK_N+3 by sequentially delaying the clock signal CLK. The first through N+3-th delay cells 2441 through 2448 may delay the clock signal CLK by substantially the same delay time. The first through N+3-th delay cells 2441 through 2448 may be controlled to increase or decrease the delay time by a delay control signal CTRL.

Each delay cell may include a plurality of sub-delay cells. For example, a second delay cell 2442 may include a first sub-delay cell 2442a, a second sub-delay cell 2442b, a third sub-delay cell 2442c and a fourth sub-delay cell 2442d. Each delay cell may output a corresponding clock signal at a node between the sub-delay cells. For example, the second delay cell 2442 may output the second clock signal CLK_2 at an output node of the second sub-delay cell 2442b, or at an input node of the third sub-delay cell 2442c.

In some embodiments, a received signal may include a clock code of 2 bits periodically inserted per N data bits, where N is an integer more than 1. In this case, the delay line 2440 may include N+3 delay cells 2441 through 2448. The delay line 2440 may output the delayed clock signal DCLK at an output node of an N+2-th delay cell 2447, or at an input node of the N+3-th delay cell 2448. Accordingly, since the received signal includes N+2 bits per period and the delayed clock signal DCLK is delayed with respect to the clock signal CLK by N+2 delay cells 2441 through 2447, a delay time of each delay cell may correspond to a length of one bit of the received signal.

Figure 15:
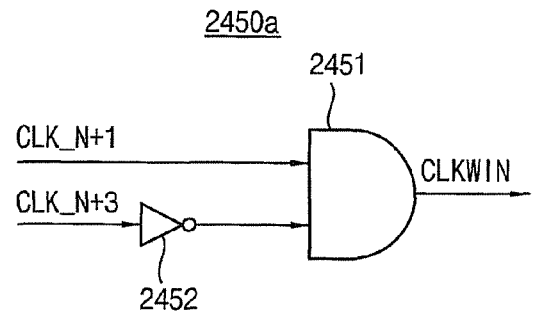
FIG. 15 is a block diagram illustrating an example of a clock window generator included in a delay locked loop unit of FIG. 13.

FIG. 15 is a block diagram illustrating an example of a clock window generator included in a delay locked loop unit of FIG. 13.

Referring to FIG. 15, a clock window generator 2450a includes an AND gate 2451 and an inverter 2452.

The inverter 2452 inverts an N+3-th clock signal CLK_N+3. The AND gate 2451 performs an AND operation on an N+1-th clock signal CLK_N+1 and an inversion signal of the N+3-th clock signal CLK_N+3. The AND gate 2451 may generate a clock window signal CLKWIN of a logic high level when the N+1-th clock signal CLK_N+1 has a logic high level and the inversion signal of the N+3-th clock signal CLK_N+3 has a logic high level. Accordingly, the AND gate 2451 may generate the clock window signal CLKWIN having the logic high level from a rising edge of the N+1-th clock signal CLK_N+1 to a rising edge of the N+3-th clock signal CLK_N+3.

Figure 16:
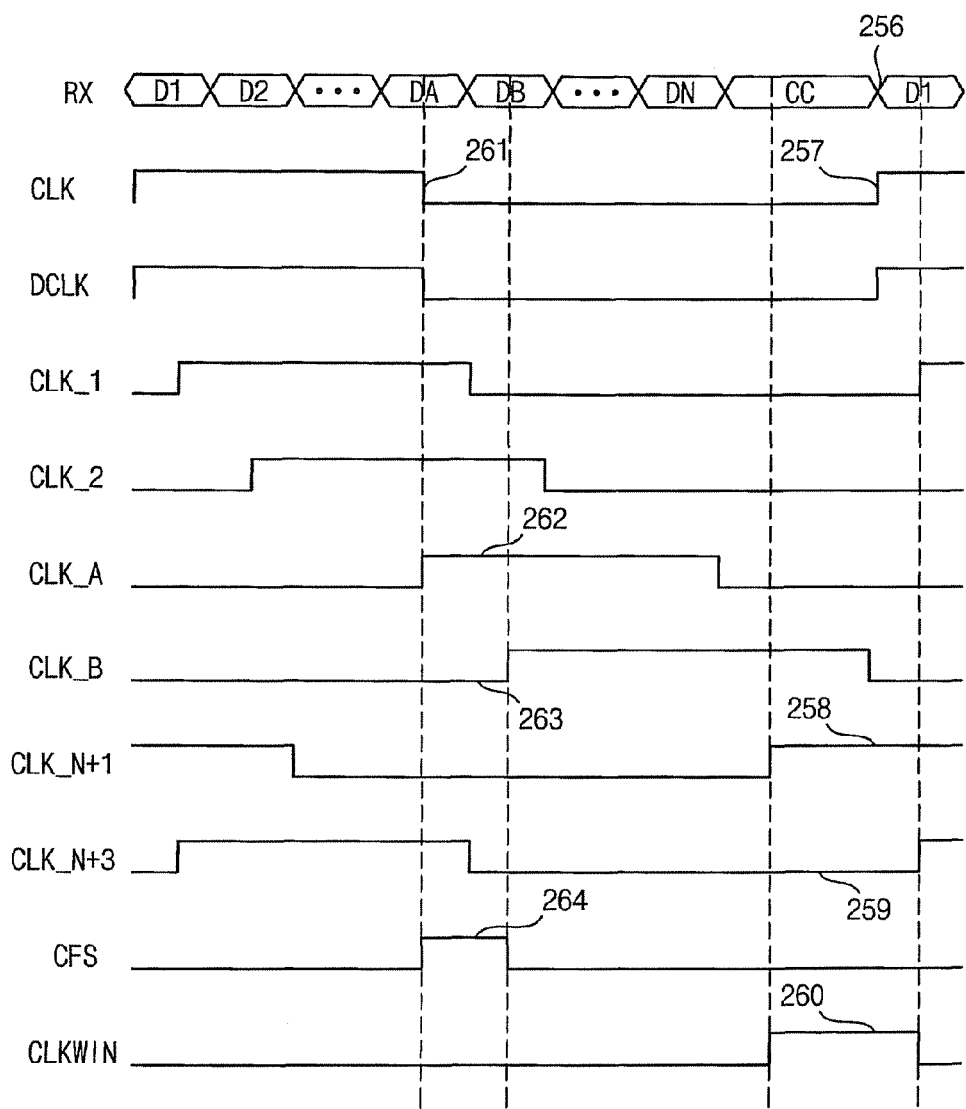
FIG. 16 is a timing diagram for describing operations of a delay line of FIG. 14 and a clock window generator of FIG. 15.

FIG. 16 is a timing diagram for describing operations of a delay line of FIG. 14 and a clock window generator of FIG. 15.

Referring to FIGS. 14 through 16, a clock signal CLK may transition from low to high at an edge 256 of a clock code CC, and a delayed clock signal DCLK may have a phase substantially the same as a phase of the clock signal CLK. A first clock signal CLK_1 output from a first delay cell 2441 may transition from low to high at the middle of a first data bit D1. Similarly, second through N-th clock signals CLK_2 through CLK_N may transition from low to high at the middle of second through N-th data bits D2 through DN, respectively. The first through N-th clock signals CLK_1 through CLK_N may be used to sample the first through N-th data bits D1 through DN.

An N+1-th clock signal CLK_N+1 may transition from low to high at the middle of a first bit of the clock code CC, and an N+2-th clock signal CLK_N+2 may transition from low to high at the middle of a second bit of the clock code CC. An N+3-th clock signal CLK_N+3 may transition from low to high at the middle of a first data bit D1 of a next period. That is, an N+3-th delay cell 2448 may output the N+3-th clock signal CLK_N+3 that is delayed by one period with respect to the first clock signal CLK_1 output from the first delay cell 2441.

A clock window generator 2450 may generate a clock window signal CLKWIN by performing a logical operation on the N+1-th clock signal CLK_N+1 and the N+3-th clock signal CLK_N+3. For example, the clock window generator 2450 may invert the N+3-th clock signal CLK_N+3, and may perform an AND operation on the N+1-th clock signal CLK_N+1 and an inversion signal of the N+3-th clock signal CLK_N+3 to generate the clock window signal CLKWIN. Accordingly, the clock window signal CLKWIN may have a logic high level 260 while the N+1-th clock signal CLK_N+1 has a logic high level 258 and the N+3-th clock signal CLK_N+3 has a logic low level 259. A clock recovery unit 2100 of FIG. 4 may detect the edge 256 of a received signal RX based on the clock window signal CLKWIN of the logic high level 260, and may generate the clock signal CLK having a rising edge 257 at the edge 256 of the received signal RX.

As described above, a CDR circuit according to some example embodiments may accurately recover a clock signal from clock embedded data by detecting an edge of a clock code using a clock window signal.

Figure 17:
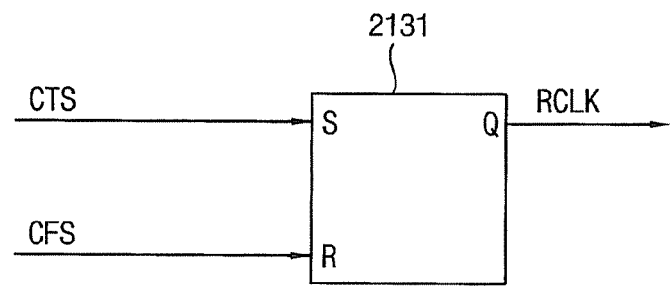
FIG. 17 is a block diagram illustrating another example of a clock signal generating unit included in a clock recovery unit of FIG. 4.

FIG. 17 is a block diagram illustrating another example of a clock signal generating unit included in a clock recovery unit of FIG. 4.

Referring to FIG. 17, a clock signal generating unit 2130 includes an SR latch 2131.

The clock signal generating unit 2130 may receive a clock fall signal CFS from a delay locked loop unit 2400 of FIG. 13. The delay locked loop unit 2400 of FIG. 13 may include a circuit that generates the clock fall signal CFS based on a multi-phase clock signal MPCS. The circuit for generating the clock fall signal CFS may have a similar configuration to that of a clock window generator 2450 of FIG. 15. Referring again to FIG. 16, the clock fall signal CFS may be generated by performing an AND operation on an A-th clock signal CLK_A and an inversion signal of a B-th clock signal CLK_B. Thus, the clock fall signal CFS may have a logic high level 264 while the A-th clock signal CLK_A has a logic high level 262 and the B-th clock signal CLK_B has a logic low level 263. The A-th clock signal CLK_A and the B-th clock signal CLK_B may be output from two delay cells located at the middle of a delay line 2440 illustrated in FIG. 14.

The SR latch 2131 may have a set terminal that receives a clock transition signal CTS, a reset terminal that receives the clock fall signal CFS, and an output terminal that outputs a recovered clock signal RCLK. The SR latch 2131 may output the recovered clock signal RCLK of a logic high level when the clock transition signal CTS has a logic high level, and may output the recovered clock signal RCLK of a logic low level when the clock fall signal CFS has a logic high level. The SR latch 2131 may maintain a previous output when both of the clock transition signal CTS and the clock fall signal CFS have logic low levels. Thus, the SR latch 2131 may generate the recovered clock signal RCLK that transitions from low to high when the clock transition signal CTS transitions from low to high and transitions from high to low when the clock fall signal CFS transitions from low to high.

Figure 18:
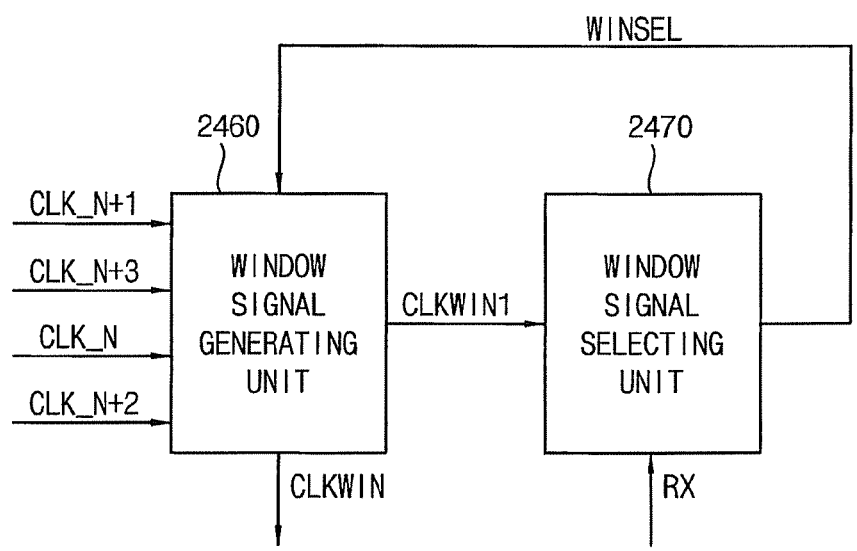
FIG. 18 is a block diagram illustrating another example of clock window generator included in a delay locked loop unit of FIG. 13.

FIG. 18 is a block diagram illustrating another example of clock window generator included in a delay locked loop unit of FIG. 13.

Referring to FIGS. 13 and 18, a clock window generator 2450*b* includes a window signal generating unit 2460 and a window signal selecting unit 2470.

The window signal generating unit 2460 receives at least a portion of a multi-phase clock signal from a delay line 2440. For example, the window signal generating unit 2460 may receive an N-th clock signal CLK_N, an N+1-th clock signal CLK_N+1, an N+2-th clock signal CLK_N+2 and an N+3-th clock signal CLK_N+3.

The window signal generating unit 2460 may generate a first window signal CLKWIN1 that has a logic high level from a rising edge of the N+1-th clock signal CLK_N+1 to a rising edge of the N+3-th clock signal CLK_N+3 by performing a logical operation on the N+1-th clock signal CLK_N+1 that leads a delayed clock signal DCLK by about 1.5-bit length and the N+3-th clock signal CLK_N+3 that lags the delayed clock signal DCLK by about 0.5-bit length. Further, the window signal generating unit 2460 may generate a second window signal that has a logic high level from a rising edge of the N-th clock signal CLK_N to a rising edge of the N+2-th clock signal CLK_N+2 by performing a logical operation on the N-th clock signal CLK_N that leads the delayed clock signal DCLK by about 2.5-bit length and the N+2-th clock signal CLK_N+2 that leads the delayed clock signal DCLK by about 0.5-bit length.

The window signal selecting unit 2470 may receive the first window signal CLKWIN1 from the window signal generating unit 2460. The window signal selecting unit 2470 may detect a time interval between the first window signal CLKWIN1 and an edge of a clock code included in a received signal RX. The window signal selecting unit 2470 determine whether the detected time interval is within a predetermined range, and may generate a window selection signal WINSEL that indicates the first window signal CLKWIN1 or the second window signal based on the determination. For example, if a rising edge of the first window signal CLKWIN1 leads the edge of the clock code by about 0.5-bit length or more, the window signal selecting unit 2470 may generate the window selection signal WINSEL that indicates the first window signal CLKWIN1. If the rising edge of the first window signal CLKWIN1 does not lead the edge of the clock code by about 0.5-bit length or more, the window signal selecting unit 2470 may generate the window selection signal WINSEL that indicates the second window signal.

The window signal generating unit 2460 may selectively output the first window signal CLKWIN1 or the second window signal as a clock window signal CLKWIN in response to the window selection signal WINSEL. Since the window signal generating unit 2460 may adaptively output the first window signal CLKWIN1 or the second window signal as the clock window signal CLKWIN, the clock window generator 2450*b* may generate the clock window signal CLKWIN that accurately envelops an edge of a clock code regardless a transmission rate and/or a delay time of a clock recovery unit 2100 of FIG. 4. Accordingly, the clock recovery unit 2100 of FIG. 4 may accurately detect the edge of the clock code to generate the clock signal CLK, and a delay locked loop unit 2400 of FIG. 13 may generate an accurate multi-phase clock signal.

Figure 19:
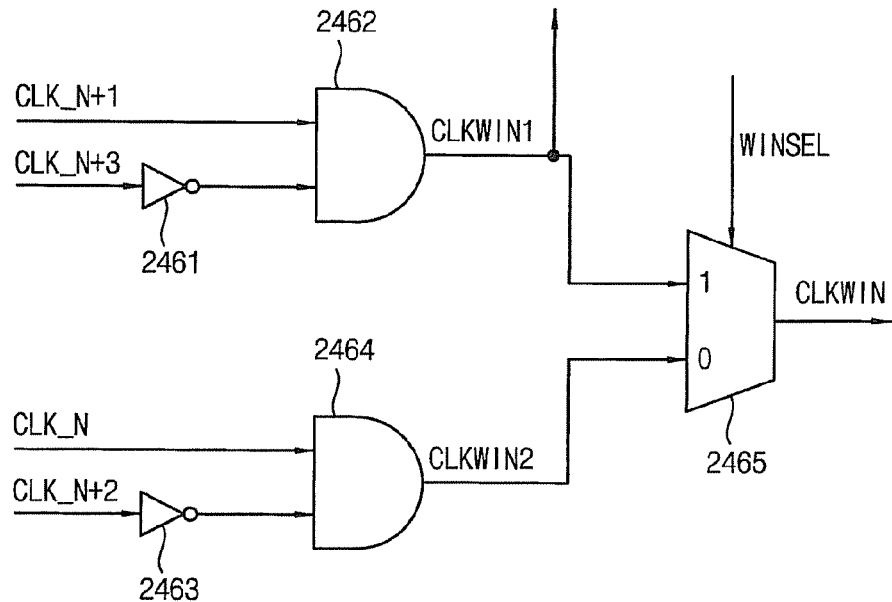
FIG. 19 is a block diagram illustrating a window signal generating unit included in a clock window generator of FIG. 18.

FIG. 19 is a block diagram illustrating a window signal generating unit included in a clock window generator of FIG. 18.

Referring to FIG. 19, a window signal generating unit 2460 includes a first inverter 2461, a first AND gate 2462, a second inverter 2463, a second AND gate 2464 and a multiplexer 2465.

The first inverter 2461 inverts an N+3-th clock signal CLK_N+3. The first AND gate 2462 performs an AND operation on an N+1-th clock signal CLK_N+1 and an inversion signal of the N+3-th clock signal CLK_N+3 to generate a first window signal CLKWIN1. Accordingly, the first window signal CLKWIN1 may have a logic high level from a rising edge of the N+1-th clock signal CLK_N+1 to a rising edge of the N+3-th clock signal CLK_N+3.

The second inverter 2463 inverts an N+2-th clock signal CLK_N+2. The second AND gate 2464 performs an AND operation on an N-th clock signal CLK_N and an inversion signal of the N+2-th clock signal CLK_N+2 to generate a second window signal CLKWIN2. Accordingly, the second window signal CLKWIN2 may have a logic high level from a rising edge of the N-th clock signal CLK_N to a rising edge of the N+2-th clock signal CLK_N+2.

The multiplexer 2465 may have a first input terminal that receives the first window signal CLKWIN1, a second input terminal that receives the second window signal CLKWIN2, a selection terminal that receives a window selection signal WINSEL from a window signal selecting unit 2470 illustrated in FIG. 18, and an output terminal that outputs a clock window signal CLKWIN. The multiplexer 2465 may selectively, output the first window signal CLKWIN1 or the second window signal CLKWIN2 as the clock window signal CLKWIN in response to the window selection signal WINSEL. For example, the multiplexer 2465 may output the first window signal CLKWIN1 as the clock window signal CLKWIN when the window selection signal WINSEL has a logic high level, and may output the second window signal CLKWIN2 as the clock window signal CLKWIN when the window selection signal WIN SEL has a logic low level.

Figure 20:
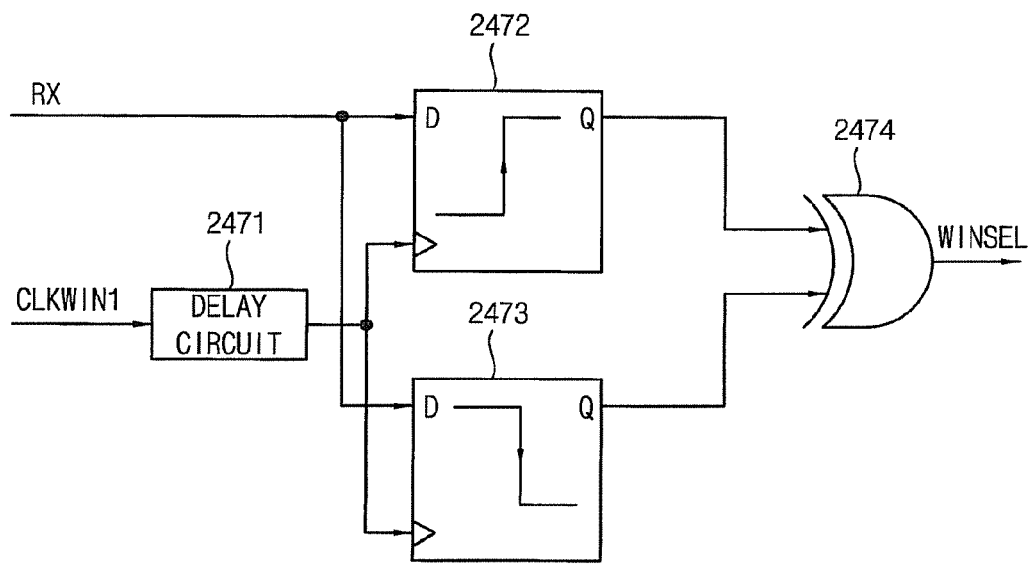
FIG. 20 is a block diagram illustrating an example of a window signal selecting unit included in a clock window generator of FIG. 18.

FIG. 20 is a block diagram illustrating an example of a window signal selecting unit included in a clock window generator of FIG. 18.

Referring to FIG. 20, a window signal selecting unit 2470a includes a delay circuit 2471, a first flip-flop 2472, a second flip-flop 2473 and an XOR gate 2474.

The delay circuit 2471 receives a first window signal CLKWIN1 from a window signal generating unit 2460 of FIG. 19. The delay circuit 2471 may delay the first window signal CLKWIN1 by about 0.5-bit length (i.e., a half of a delay time of a delay cell). A delay time of the delay circuit 2471 may be determined based on a desired margin of a rising edge of a clock window signal with respect to an edge of a clock code included in a received signal RX.

The first flip-flop 2472 latches the received signal RX in response to the delayed first window signal CLKWIN1. The first flip-flop 2472 may be implemented with a rising edge triggered flip-flop, which has a data terminal that receives the received signal RX, a clock terminal that receives the delayed first clock window CLKWIN1, and an output terminal. The first flip-flop 2472 may output the received signal RX at a rising edge of the delayed first window signal CLKWIN1.

The second flip-flop 2473 latches the received signal RX in response to the delayed first window signal CLKWIN1. The second flip-flop 2473 may be implemented with a falling edge triggered flip-flop, which has a data terminal that receives the received signal RX, a clock terminal that receives the delayed first clock window CLKWIN1, and an output terminal. The second flip-flop 2473 may output the received signal RX at a falling edge of the delayed first window signal CLKWIN1.

The XOR gate 2474 performs an XOR operation on an output signal of the first flip-flop 2472 and an output signal of the second flip-flop 2473. If a logic level of the output signal of the first flip-flop 2472 is the same as that of the output signal of the second flip-flop 2473, the first window signal CLKWIN1 may not be appropriate for an edge detection of the clock code included in the received signal RX. In this case, the XOR gate 2474 may generate the window selection signal WINSEL of a logic low level, and a multiplexer 2465 illustrated in FIG. 19 may output the second window signal CLKWIN2 as the clock window signal.

If logic level of the output signal of the first flip-flop 2472 is different from that of the output signal of the second flip-flop 2473, the first window signal CLKWIN1 may have a margin more than the delay time of the delay circuit 2471 with respect to the edge of the clock code, and the first window signal CLKWIN1 may be appropriate for the edge detection. In this case, the XOR gate 2474 may generate the window selection signal WINSEL of a logic high level, and a multiplexer 2465 illustrated in FIG. 19 may output the first window signal CLKWIN1 as the clock window signal.

Accordingly, a clock window generator including the window signal selecting unit 2470a may generate the clock window signal that has a desired margin with respect to the edge of the clock code. Therefore, the edge of the clock code may be accurately detected even if the received signal RX is transmitted at a high rate or a delay time of a clock recovery unit is long.

In some embodiments, the window signal selecting unit 2470a may perform the window selection operation that selects the first window signal CLKWIN1 or the second window signal CLKWIN2 in a training mode, and may operate as a clock window checker that detects an error on a data transmission in a display data mode. In the display data mode, the window signal selecting unit 2470a may receive the clock window signal determined in the training mode, and may check whether the clock code has the edge within the clock window. If the received signal RX does not include the clock code having the edge within the clock window, a display device including the window signal selecting unit 2470a may operate again in the training mode.

Figure 21A:
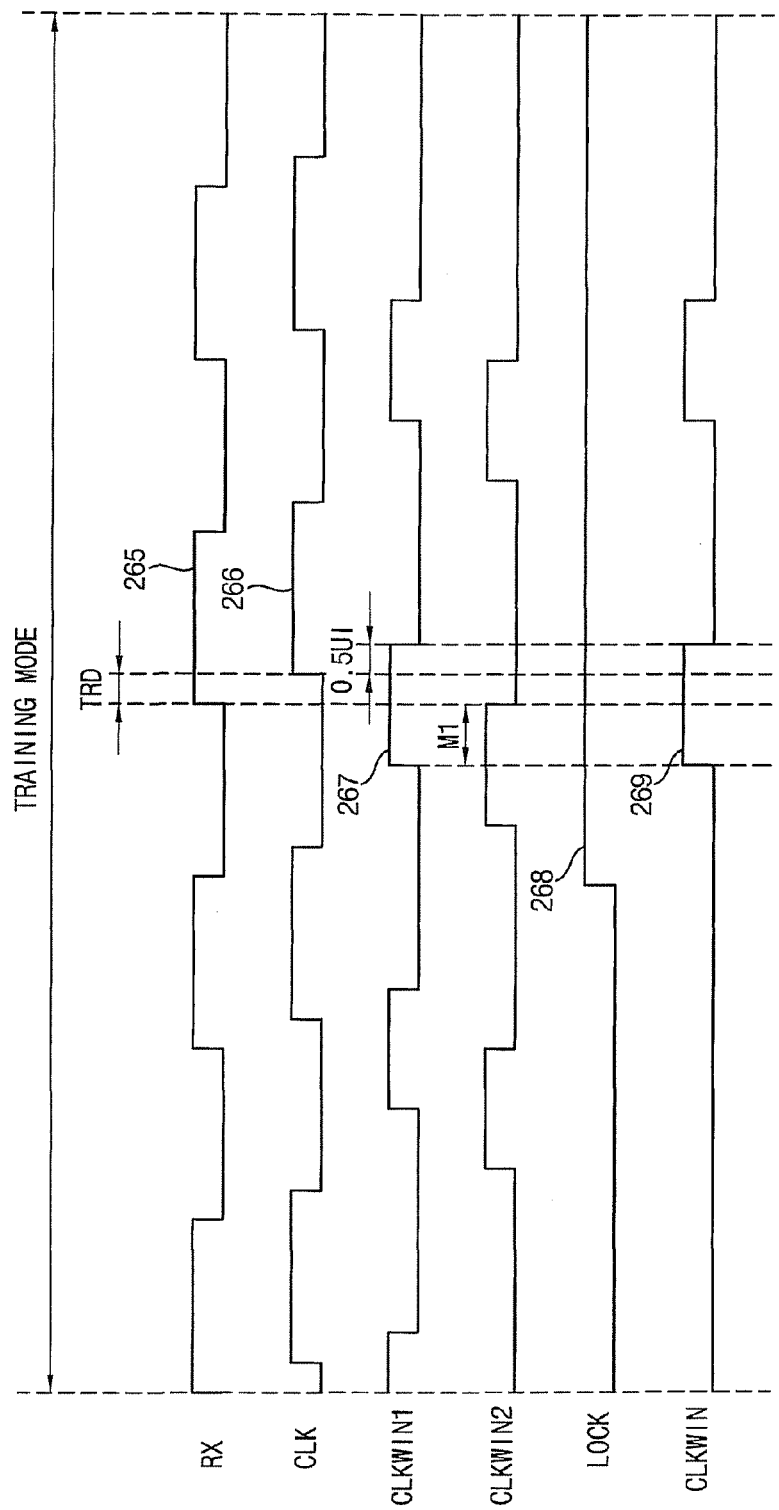
FIGS. 21A and 21B are timing diagrams for describing examples of an operation of a window signal selecting unit of FIG. 20.

FIG. 21A is a timing diagram for describing an example of an operation of a window signal selecting unit of FIG. 20.

Referring to FIGS. 20 and 21A, if a delay locked loop unit 2400 of FIG. 13 is locked in a training mode, a lock signal LOCK has a logic high level 268. Once the lock signal LOCK has the logic high level 268, a window signal selecting unit 2470a may perform an adaptive window selection operation in the training mode. A clock signal CLK generated by a clock recovery unit 2100 of FIG. 4 may be delayed by a recovery delay time TRD with respect to a received signal RX. Since a pulse 267 of a first window signal CLKWIN1 has a rising edge that leads a rising edge of the clock signal CLK by about 1.5-bit length, the first window signal CLKWIN1 may have a margin M1 calculated by subtracting the recovery delay time TRD from the 1.5-bit length. If the margin M1 of the first window signal CLKWIN1 is more than a predetermined value (e.g., about 0.5-bit length), the window signal selecting unit 2470a may select the first window signal CLKWIN1 as a clock window signal CLKWIN. Accordingly, in a display data mode, an edge of a clock code included in the received signal RX may be accurately detected using pulses 269 of the clock window signal CLKWIN.

Figure 21B:
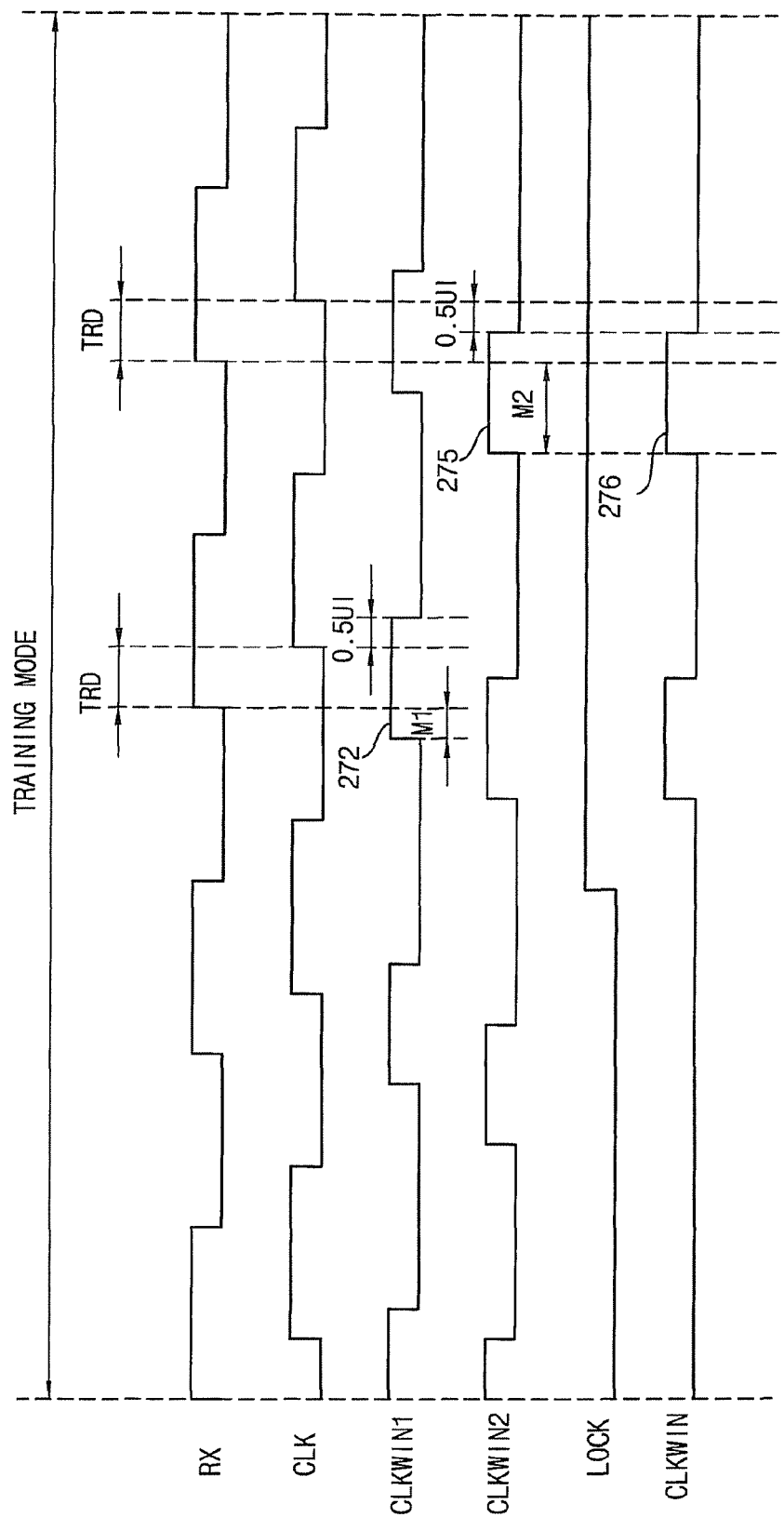

FIG. 21B is a timing diagram for describing another example of an operation of a window signal selecting unit of FIG. 20.

Referring to FIGS. 20 and 21B, a pulse 272 of a first window signal CLKWIN1 may have a margin M1 with respect to a received signal RX. If the margin M1 of the first window signal CLKWIN1 is less than a predetermined value (e.g., about 0.5-bit length), the first window signal CLKWIN1 may not be appropriate for an edge detection of a clock code in the received signal RX. Thus, a second window signal CLKWIN2 that leads the first window signal CLKWIN1 by about 1-bit length may be selected as a clock window signal CLKWIN. A pulse 275 of the second window signal CLKWIN2 may have a margin M2 that is more than the predetermined value with respect to the received signal RX. Accordingly, in a display data mode, an edge of a clock code included in the received signal RX may be accurately detected using pulses 276 of the clock window signal CLKWIN.

As described above, a clock window generator 2450b of FIG. 18 may adaptively generate a clock window signal CLKWIN according to a transmission rate and/or a delay time. Accordingly, a clock recovery unit including the clock window generator 2450b may accurately detect a clock code transmitted at a high rate using the adaptively generated clock window signal CLKWIN.

Figure 22:
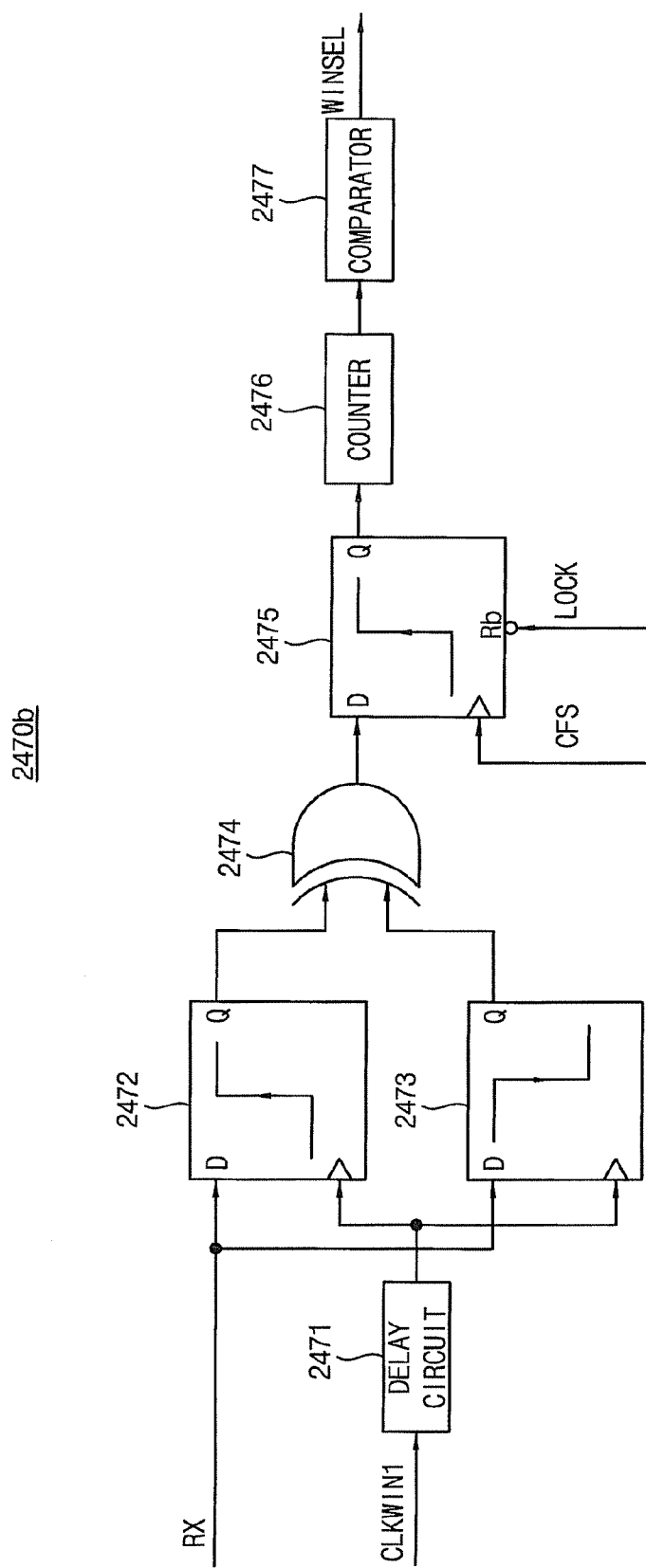
FIG. 22 is a block diagram illustrating another example of a window signal selecting unit included in a clock window generator of FIG. 18.

FIG. 22 is a block diagram illustrating another example of a window signal selecting unit included in a clock window generator of FIG. 18.

Referring to FIG. 22, a window signal selecting unit 2470b includes a delay circuit 2471, a first flip-flop 2472, a second flip-flop 2473, an XOR gate 2474, a third flip-flop 2475, a counter 2476 and a comparator 2477.

The delay circuit 2471 delays a first window signal CLKWIN1 by a desired margin. The first flip-flop 2472 outputs a received signal RX at a rising edge of the delayed first window signal CLKWIN1. The second flip-flop 2473 outputs the received signal RX at a falling edge of the delayed first window signal CLKWIN1. The XOR gate 2474 performs an XOR operation on an output signal of the first flip-flop 2472 and an output signal of the second flip-flop 2473, and outputs a signal that indicates whether an edge of a clock code included in the received signal RX exists between the rising edge and the falling edge of the delayed first window signal CLKWIN1.

The third flip-flop 2475 latches the output signal of the XOR gate 2474 in response to a clock signal (e.g., a clock fall signal CFS illustrated in FIG. 16). The third flip-flop 2475 may be implemented with a rising edge triggered flip-flop, which has a data terminal that receives the output signal of the XOR gate 2474, a clock terminal that receives the clock signal, an inversion reset terminal that receives a lock signal LOCK, and an output terminal. The third flip-flop 2475 may start to operate when a lock detector 2420 illustrated in FIG. 13 outputs the lock signal LOCK of a logic, high level. The third flip-flop 2475 may be synchronized with the counter 2476 and the comparator 2477 using the clock signal.

The counter 2476 performs a counting operation in response to an output signal of the third flip-flop 2475. The counter 2476 may be implemented with a plurality of serial-connected flip-flops. The comparator 2477 compares a counting value of the counter 2476 with a predetermined value. The counter 2476 and the comparator 2477 may check whether the output signal of the third flip-flop 2475 is maintained at a fixed level during a predetermined time, and may output a window selection signal WINSEL if the output signal of the third flip-flop 2475 is maintained during the predetermined time. For example, if the output signal of the third flip-flop 2475 is maintained at a logic high level during the predetermined time, the counter 2476 and the comparator 2477 may output the window selection signal WINSEL indicating the first window signal CLKWIN1. If the output signal of the third flip-flop 2475 is maintained at a logic low level during the predetermined time, the counter 2476 and the comparator 2477 may output the window selection signal WINSEL indicating a second window signal CLKWIN2.

In some embodiments, the window signal selecting unit 2470b may perform the window selection operation that selects the first window signal CLKWIN1 or the second window signal CLKWIN2 in a training mode, and may operate as a clock window checker that detects an error on a data transmission in a display data mode.

Figure 23:
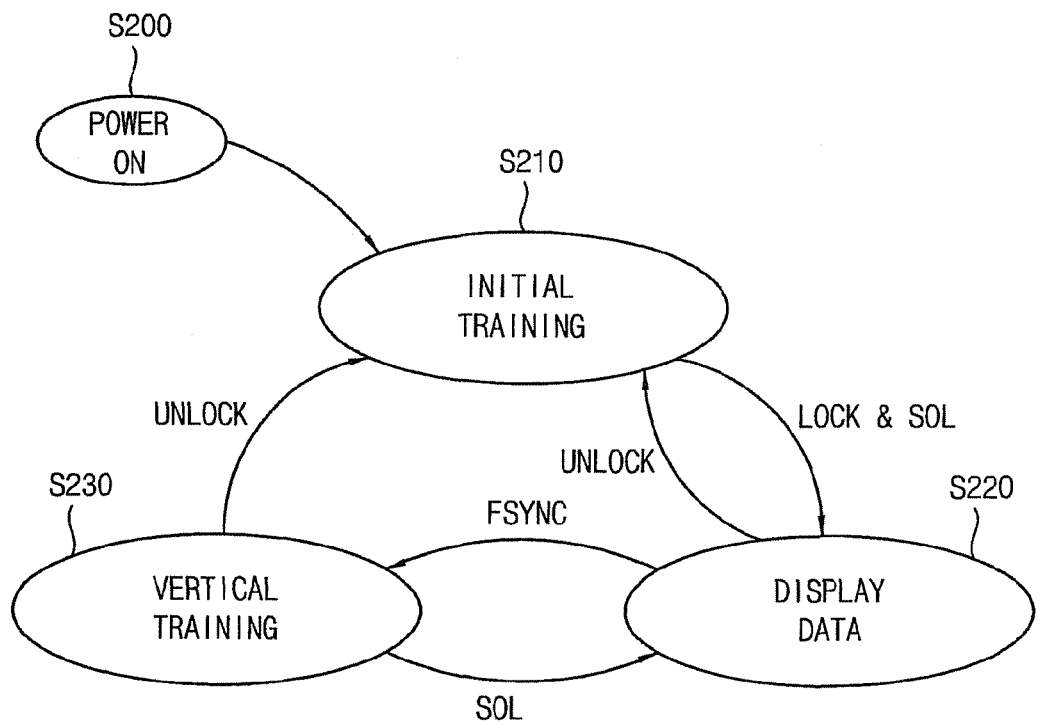
FIG. 23 is a state diagram illustrating an example of operating modes of a display device illustrated in FIG. 1.

FIG. 23 is a state diagram illustrating an example of operating modes of a display device illustrated in FIG. 1.

Referring to FIGS. 1 and 23, if a display device 1000 is powered on S200, the display device 1000 operates in an initial training mode S210. The display device 1000 may perform an initialization operation in the initial training mode S210. In the initial training mode S210, a timing controller 1100 may transmit a clock training signal to source drivers 1200, and a CDR circuit in each source driver 1200 may be locked in response to the clock training signal.

After the CDR circuits included in all of the source drivers 1200 are locked, the display device 1000 operates in a display data mode S220. The timing controller 1100 may inform the source drivers 1200 of a start of the display data mode S220 by transmitting data including a line start field SOL to the source drivers 1200. The display device 1000 may operate in the display data mode S220 during a data transfer period of an image frame. In the display data mode S220, the timing controller 1100 may transfer data packets respectively corresponding to lines of the image frame to the source drivers 1200.

After image data of an image frame are transferred, the display device 1000 operates in a vertical training mode S230 until image data of a next image frame are transferred. The timing controller 1100 may inform the source drivers 1200 of an end of the display data mode S220 by transmitting data including a frame synchronization signal FSYNC to the source drivers 1200. The display device 1000 may operate in the vertical training mode S230 during a vertical blank period of an image frame. In the vertical training mode S230, the timing controller 1100 may transmit a modulated clock signal to the source drivers 1200. Since the timing controller 1100 transmits the modulated clock signal to the source drivers 1200 in the vertical blank period, an electromagnetic interference (EMI) may be reduced. In some embodiments, the display device 1000 may operate in the initial training mode S210 or in the display data mode S220 without the vertical training mode S230.

The display data mode S220 and the vertical training mode S230 may be performed per image frame. The display data mode S220 and the vertical training mode S230 may be repeatedly performed until the display device 1000 is powered off or until the CDR circuits in the source drivers 1200 are unlocked by a soft fail. When an operating mode of the display device 1000 changes from the vertical training mode S230 to the display data mode S220, the timing controller 1100 may transfer the data including the line start field SOL to the source drivers 1200. When the operating mode of the display device 1000 changes from the display data mode S220 to the vertical training mode S230, the timing controller 1100 may transfer the data including the frame synchronization signal FSYNC to the source drivers 1200.

If the CDR circuit is unlocked while the display data mode S220 or the vertical training mode S230 is performed, the display device 1000 may operate again in the initial training mode S210. In the initial training mode S210, the timing controller 1100 transmits the clock training signal to the source drivers 1200, the CDR circuits in the source drivers 1200 may be locked in response to the clock training signal. In the initial training mode S210, the source drivers 1200 may initialize setting values changed by the soft fail.

Figure 24:
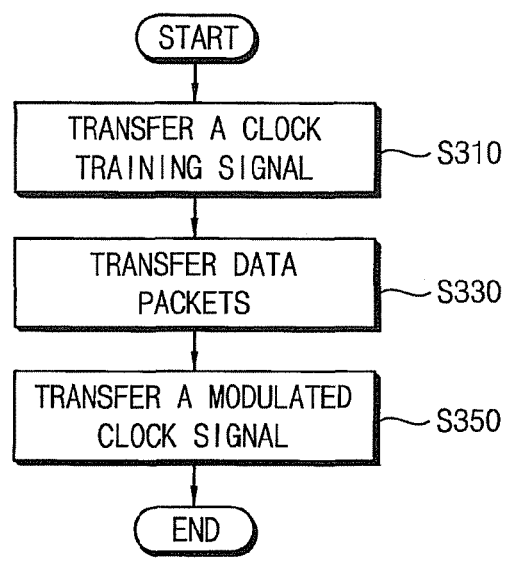
FIG. 24 is a flow chart illustrating a method of transferring data in a display device of FIG. 1.

FIG. 24 is a flow chart illustrating a method of transferring data in a display device of FIG. 1.

Referring to FIGS. 1 and 24, a timing controller 1100 transmits a clock training signal to source drivers 1200 through clock embedded data channels CEDC to lock CDR circuits in an initial training mode (Step S310). For example, the timing controller 1100 may transmit the clock training signal when a display device 1000 is powered on or when a soft fail occurs in the source drivers 1200. The source drivers 1200 may be stabilized in the initial training mode. For example, in the initial training mode, the CDR circuit included in each source driver 1200 may be locked in response to the clock training signal, and setting values of the source drivers may be initialized.

The timing controller 1000 transfers data packets respectively corresponding to lines of an image frame to the source drivers 1200 through the clock embedded data channels CEDC in a display data mode (Step S330). The data packets may include data bits and clock codes periodically inserted into the data bits. The CDR circuit in each source driver 1200 may generate recover a clock signal by detecting an edge between each clock code and a data bit adjacent to the clock code. The source drivers 1200 may sample the data bits based on the recovered clock signal, and may drive a display panel 1300 based on the sampled data bits.

The timing controller 1000 transmits a modulated clock signal to the source drivers 1200 through the clock embedded data channels CEDC in a vertical training mode (Step S350). The modulated clock signal may be generated by adjusting at least one of a rising edge and a falling edge of the clock training signal. In some embodiments, in the vertical training mode, the timing controller 1100 may transmit the clock training signal without the modulation during a predetermined time before the display data mode starts. The transfer of the data packets and the transfer of the modulated clock signal may be repeatedly performed per image frame.

The source drivers 1200 may provide lock state information to the timing controller through a shared back channel SBC. In some embodiments, the source drivers 1200 may change a voltage of the shared back channel SBC to provide the lock state information. In other embodiments, the timing controller 1100 may provide order information to the source drivers 1200 through the clock embedded data channels CEDC, and the source drivers 1200 may provide the lock state information during response times indicated by the order information, respectively. If the timing controller 1100 receives the lock state information indicating that a CDR circuit in a source driver is unlocked, the timing controller 1100 may transmit again the clock training signal to all of the source drivers 1200 or to a source driver including the unlocked CDR circuit.

The method of transferring the data according to some example embodiments may be suitable for an intra-panel interface employing a clock embedding technology. Further, the method of transferring the data according to some example embodiments may reduce the EMI, and may efficiently recover the soft fail.

Figure 25:
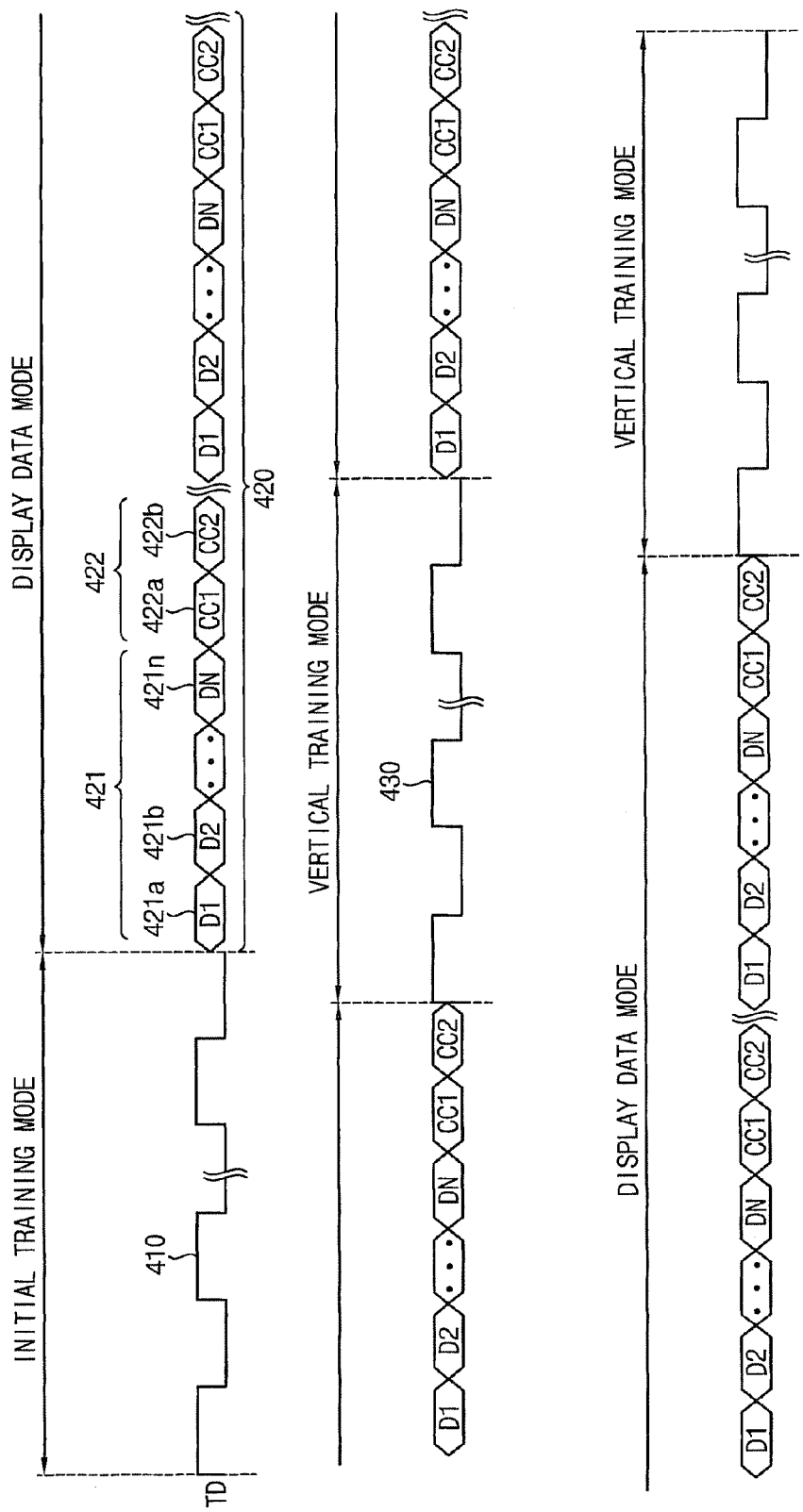
FIG. 25 is a diagram illustrating signals transferred in a display device of FIG. 1.

FIG. 25 is a diagram illustrating signals transferred in a display device of FIG. 1.

Referring to FIGS. 1 and 25, a timing controller 1100 may transmit a clock training signal 410 to source drivers 1200 through clock embedded data channels CEDC in an initial training mode. The timing controller 1100 may transfer data packets respectively corresponding to lines of an image frame to the source drivers 1200 through the clock embedded data channels CEDC in a display data mode. A data packet 420 may include a plurality of data bits 421 and a clock code 422 periodically inserted into the data bits 421. The clock code 422 may be appended per N data bits 421*a*, 421*b* and 421*n*, where N is an integer more than 1. In some embodiments, as illustrated in FIG. 25, the clock code 422 may have two bits including a first bit 422*a* and a second bit 422*b*. In other embodiments, the clock code 422 may have one bit. After the data packets in the image frame are transferred, the timing controller 1100 may transmit a modulated clock signal 430 to the source drivers 1200 through the clock embedded data channels CEDC in a vertical training mode. The modulated clock signal 430 may be generated by adjusting at least one of a rising edge or a falling edge of the clock training signal. After the vertical training mode, data packets for a next image frame may be transferred in a next display data mode. The display data mode and the vertical training mode may be repeatedly performed.

Figure 26:
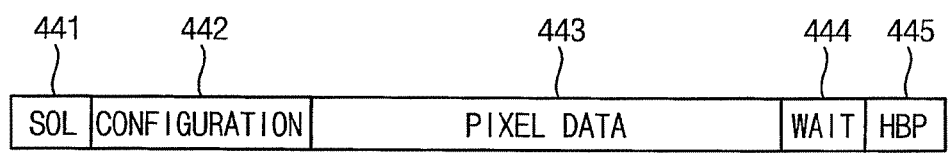
FIG. 26 is a diagram illustrating a data packet corresponding to one line of an image frame in a display data mode.

FIG. 26 is a diagram illustrating a data packet corresponding to one line of an image frame in a display data mode.

Referring to FIG. 26, a data packet 440 includes a line start field 441, a configuration field 442, a pixel data field 443, a wait field 444 and a horizontal blank field 445.

The line start field 441 indicates a start of each line of an image frame. A source driver may operate an internal counter in response to the line start field 441, and may identify the configuration field 442, the pixel data field 443 and the wait field 444 based on a counting result of the internal counter. The line start field 441 may include a clock code having a specific edge or pattern to be distinguished from the horizontal blank field 445 of a previous line or from a vertical blank period of a previous image frame.

The configuration field 442 may include configuration data for controlling the source driver. Since the configuration data are written in the configuration field 442, a display device 1000 of FIG. 1 may not require a line for transmitting a control signal. When a data packet corresponding to a last line of an image frame is transferred, the configuration data written in the configuration field 442 of the data packet may include a frame synchronization signal. The source driver may know that a vertical training mode is to be started by receiving the frame synchronization signal written in the configuration field 442. The configuration data may further include setting values, such as a bias value, equalization value, etc. In some embodiments, the configuration data may further include a configuration update bit that indicates whether the configuration data is updated. For example, the source driver may not process the configuration data written in the configuration field 442 if the configuration update bit has a logic low level, and may change the setting values based on the configuration data if the configuration update bit has a logic high level.

The pixel data field 443 includes image data. The source driver may receive the image data written in the pixel data field 443, and may drive the display panel to display an image based on the image data. The wait field 444 is assigned for the source driver to have an enough time to receive and to store the image data. In some embodiments, data bits in the pixel data field 443 and the wait field 444 may be scrambled, and the source driver may recover the image data by descrambling the scrambled data bits. An EMI may be reduced by transferring the scrambled data bits in the pixel data field 443 and the wait field 444.

The horizontal blank field 445 is assigned for the source driver to have an enough time to drive the display panel based on the image data. For example, the horizontal blank field 445 may have a bit length corresponding to a time when the image data stored in a data latch unit are converted in analog voltages and are applied to the display panel. The horizontal blank field 445 may have an edge of a predetermined direction or may have a clock code of a predetermined pattern to be distinguished from the line start filed 441.

Figure 27A:
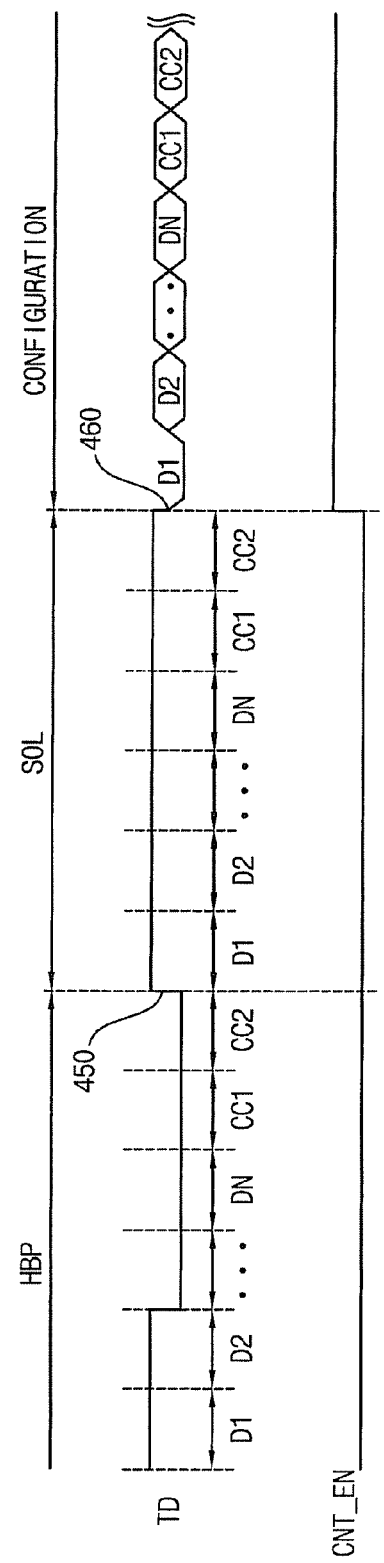
FIGS. 27A and 27B are diagrams illustrating examples of a horizontal blank field and a line start field included in a data packet of FIG. 26.

FIG. 27A is a diagram illustrating an example of a horizontal blank field and a line start field included in a data packet of FIG. 26.

Referring to FIG. 27A, a horizontal blank field HBP includes a clock code having a rising edge 450, and a line start field SOL includes a clock code having a falling edge 460 that is different form the rising edge 450 of the clock code included in the horizontal blank field HBP. A source driver may indentify the line start field SOL by detecting the falling edge 460 while a counter enable signal CNT_EN has a logic low level. The source driver may operate an internal counter by activating the counter enable signal CNT_EN at a logic low level, and may identify a configuration field, a pixel data field and a wait field based on a counting result of the internal counter. Although FIG. 27A illustrates an example where the horizontal blank field HBP includes the clock code have the rising edge 450 and the line start field SOL includes the clock code having the falling edge 460, each clock code of the horizontal blank field HBP may have a falling edge and the clock code of the line start field SOL may have a rising edge.

Figure 27B:
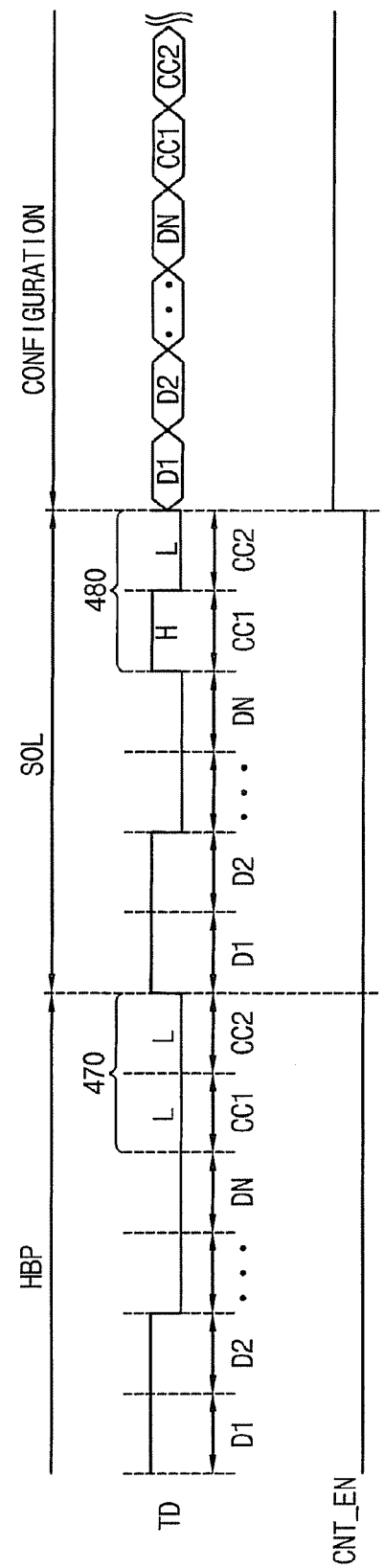

FIG. 27B is a diagram illustrating another example of a horizontal blank field and a line start field included in a data packet of FIG. 26.

Referring to FIG. 27B, a horizontal blank field HBP includes a clock code having a predetermined pattern 470, and a line start field SOL includes a clock code having a pattern 480 that is different form the pattern 470 of the clock code included in the horizontal blank field HBP. For example, each clock code of the horizontal blank field HBP may have a first bit of a logic low level and a second bit of a logic low level, and the clock code of the line start field SOL may have a first bit of a logic high level and a second bit of a logic low level. A source driver may indentify the line start field SOL by detecting the clock code having the first bit of the logic high level and the second bit of the logic low level.

Figure 28A:
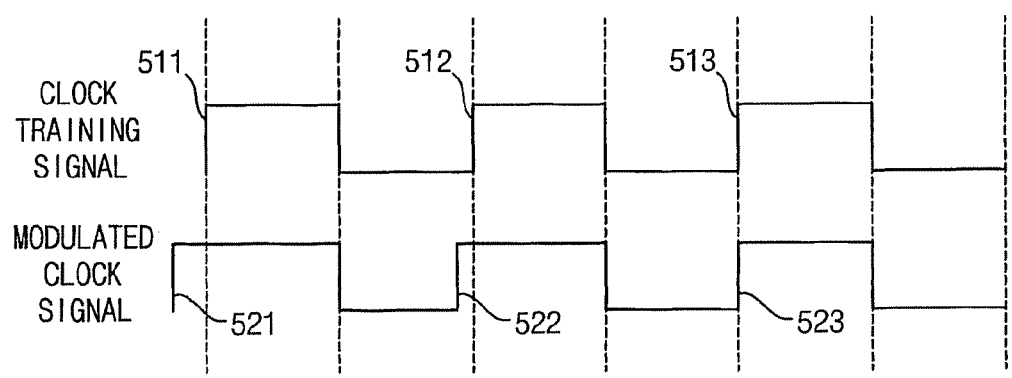
FIGS. 28A through 28C are diagrams illustrating examples of a modulated clock signal transferred in a vertical training mode.

FIG. 28A is a diagram illustrating an example of a modulated clock signal transferred in a vertical training mode.

Referring to FIG. 28A, a modulated clock signal may be generated by modulating rising edges 521, 522 and 523. For example, at least some of rising edges 521 and 522 of the modulated clock signal may have positions different from those of rising edges 511 and 512 of the clock training signal. Since the modulated clock signal is transferred, an EMI ay be reduced.

Figure 28B:
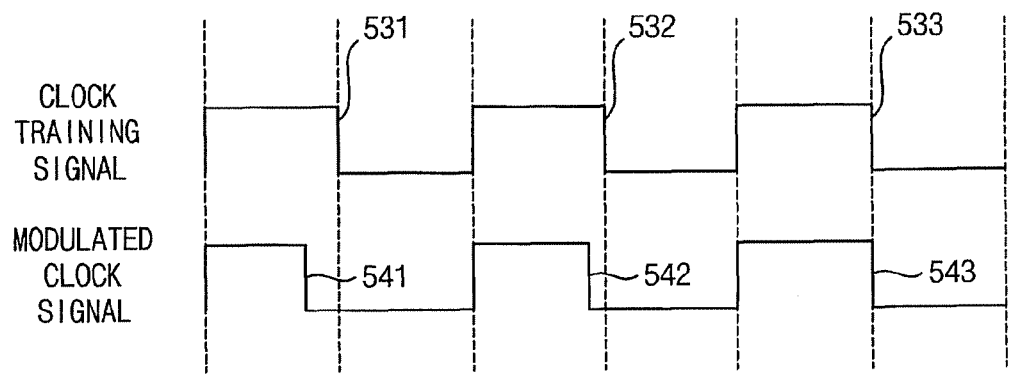

FIG. 28B is a diagram illustrating another example of a modulated clock signal transferred in a vertical training mode.

Referring to FIG. 28B, a modulated clock signal may be generated by modulating falling edges 541, 542 and 543. For example, at least some of falling edges 541 and 542 of the modulated clock signal may have positions different from those of falling edges 531 and 532 of the clock training signal.

Figure 28C:
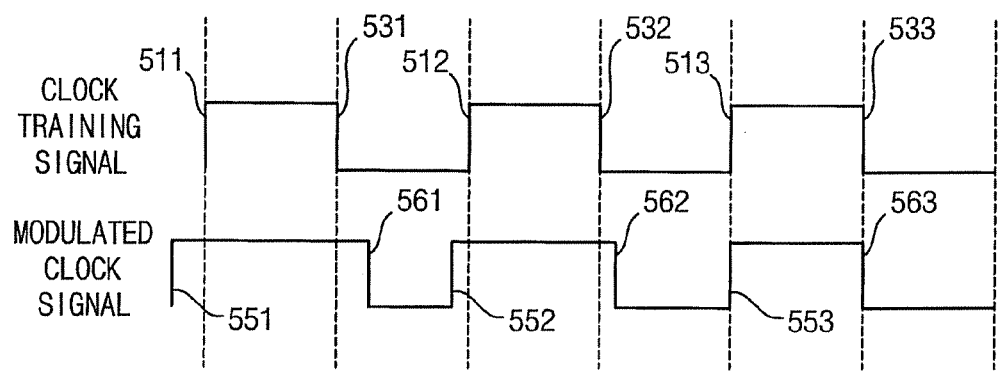

FIG. 28C is a diagram illustrating still another example of a modulated clock signal transferred in a vertical training mode.

Referring to FIG. 28C, a modulated clock signal may be generated by modulating rising edges 551, 552 and 553 and falling edges 561, 562 and 563 of a clock training signal. For example, at least some of rising edges 551 and 552 and falling edges 561 and 562 of the modulated clock signal may have positions different from those of rising edges 511 and 512 and falling edges 531 and 532 of the clock training signal.

Figure 29:
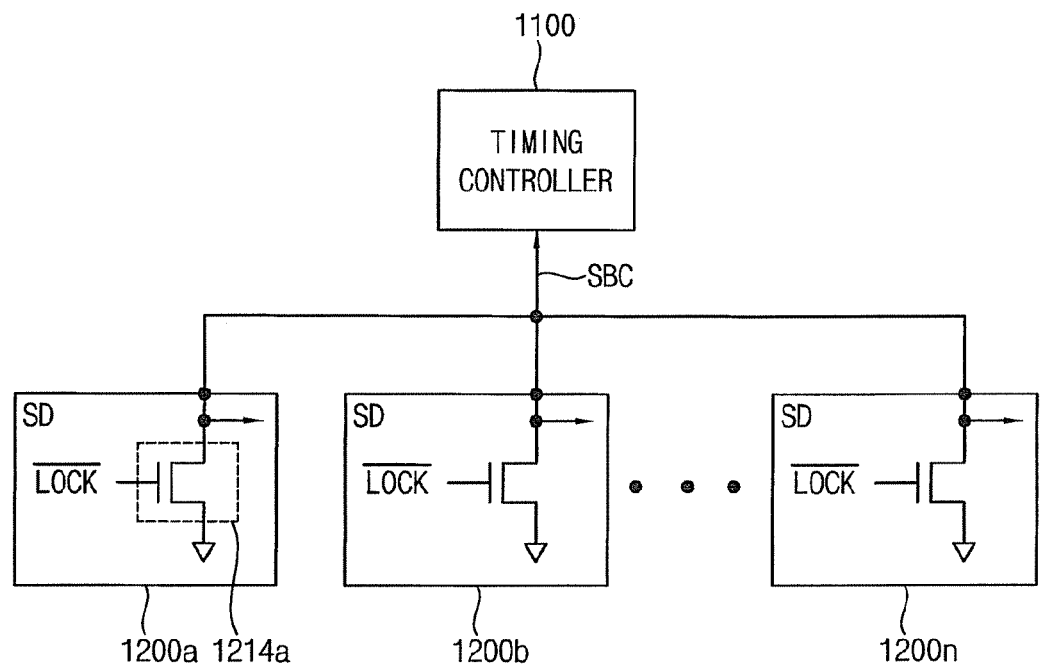
FIG. 29 is a block diagram for describing an example of an operation of a display device of FIG. 1 that transmits lock state information.

FIG. 29 is a block diagram for describing an example of an operation of a display device of FIG. 1 that transmits lock state information.

Referring to FIG. 29, a shared back channel SBC may be coupled between a timing controller 1100 and first through N-th source drivers 1200a through 1200n. The first through N-th source drivers 1200a through 1200n transfer lock state information to the timing controller 1100 through the shared back channel SBC. A timing controller 1100 may know whether the first through N-th source drivers 1200a through 1200n are locked or unlocked based on the lock state information transferred through the shared back channel SBC. Although FIG. 29 illustrates the shared back channel SBC coupled in a multi-drop topology, the shared back channel SBC may be coupled in a daisy chain topology.

Each source driver 1200a through 1200n may include a shared back channel transmitter 1214a for transferring the lock state information. The shared back channel transmitter 1214a may include a transistor 1200a being turned on in response to an inversion lock signal/LOCK indicating that a CDR circuit included in the source driver is unlocked. The transistor 1200a may change a voltage of the shared back channel SBC when the CDR circuit is unlocked. The timing controller may detect the change of the voltage of the shared back channel SBC, and may know that at least one CDR circuit included in the first through N-th source drivers 1200a through 1200n is unlocked based on the detected change. In addition, a source driver where a CDR circuit is not unlocked may know that a CDR circuit included in another source driver is unlocked by detecting the change of the voltage of the shared back channel SBC.

If the timing controller 1100 detects the change of the voltage of the shared back channel SBC, the timing controller 1100 may transmit a clock training signal to the first through N-th source drivers 1200a through 1200n. The first through N-th source drivers 1200a through 1200n may be stabilized in response to the clock training signal, and the soft fail may be recovered.

Figure 30:
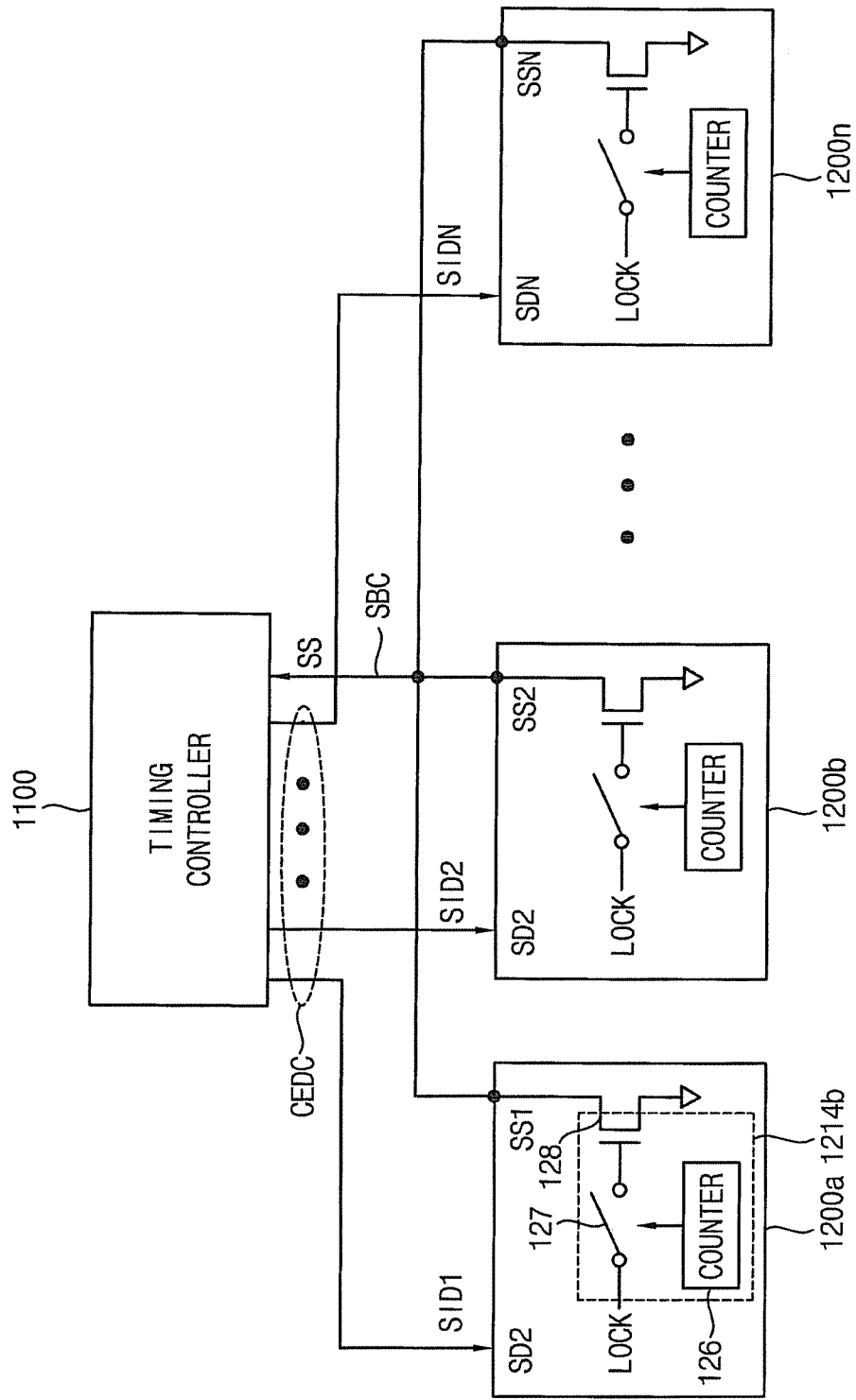
FIG. 30 is a block diagram for describing another example of an operation of a display device of FIG. 1 that transmits lock state information.

FIG. 30 is a block diagram for describing another example of an operation of a display device of FIG. 1 that transmits lock state information.

Referring to FIG. 30, a timing controller 1100 provides first through N-th order information SID1 through SIDN to first through N-th source drivers 1200a through 1200n through clock embedded data channels CEDC. For example, the first through N-th order information SID1 through SIDN may be written in a configuration field 442 illustrated in FIG. 26. The first through N-th source drivers 1200a through 1200n may know their order based on the first through N-th order information SlD1 through SIDN, respectively.

The first through N-th source drivers 1200a through 1200n may transmit first through N-th state signals SS1 through SSN during response times indicated by the first through N-th order information SID1 through SIDN. Each source driver 1200a through 1200n may include a shared back channel transmitter 1214b for transmitting the state signal SS1 through SSN to provide lock state information. The shared back channel transmitter 1214b may include a counter 126, a switch 127 and a transistor 128. The counter 126 may check the response time, and may turn on the switch during the response time. While the switch 127 is turned on, a lock signal LOCK indicating that a CDR circuit is locked may be applied to the transistor 128. The transistor 128 may change a voltage of a shared back channel SBC during the response time if the source driver normally operates.

Different response times are assigned to source driver 1200a, 1200b and 1200n, and each source driver 1200a, 1200b and 1200n may transmit the state signal SS1, SS2 and SSN at a corresponding response time. If the timing controller 1100 does not receive the state signal SS at a predetermined response time, the timing controller 1100 may know that a soft fail occurs in a source driver corresponding to the predetermined response time. The timing controller 1100 may transfer a clock training signal to the source driver where the soft fail occurs. The source driver where the soft fail occurs may be stabilized in response to the clock training signal, and source drivers where the soft fail does not occur may continuously display an image.

Figure 31:
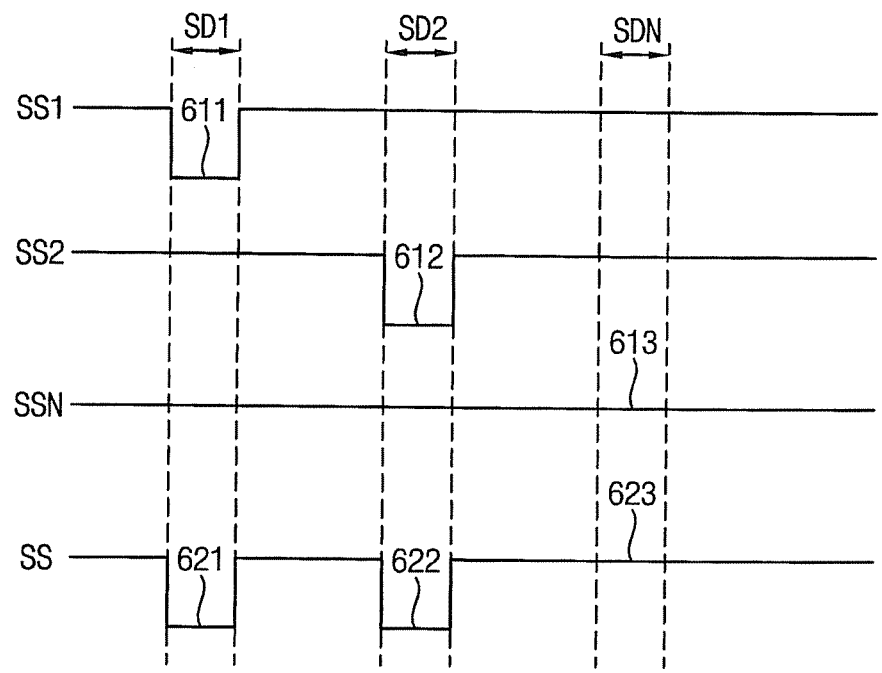
FIG. 31 is a diagram illustrating state signals transferred by the operating illustrated in FIG. 30.

FIG. 31 is a diagram illustrating state signals transferred by the operating illustrated in FIG. 30.

Referring to FIGS. 30 and 31, first through N-th source drivers 1200a, 1200b and 1200n may transmit first through N-th state signal SS1, SS2 and SSN during predetermined response times, respectively, a timing controller 1100 may know whether a soft fail occurs in the first through N-th source drivers 1200a, 1200b and 1200n based on a state signal SS.

For example, the first source driver 1200a may change a voltage of a shared back channel SBC at a logic low level 611 during a first response time corresponding to the first source driver 1200a to report that the first source driver 1200a normally operates to the timing controller. The timing controller 1100 may know that the first source driver 1200a normally operates by receiving the state signal SS having a logic low level 621 during the first response time. The second source driver 1200b may change the voltage of the shared back channel SBC at a logic low level 612 during a second response time, and the timing controller 1100 may know that the second source driver 1200b normally operates by receiving the state signal SS having a logic low level 622 during the second response time.

If a soft fail occurs in the N-th source driver 1200n, the N-th source driver 1200n may maintain the voltage of the shared back channel SBC at a logic high level 613 during an N-th response time. The timing controller 1100 may know that the soft fail occurs in the N-th source driver 1200n by receiving the state signal SS having a logic high level 623 during the N-th response time. The timing controller 1100 may transmit a clock training signal to the N-th source driver 1200n, and the N-th source driver 1200n may be stabilized in response to the clock training signal.

Figure 32:
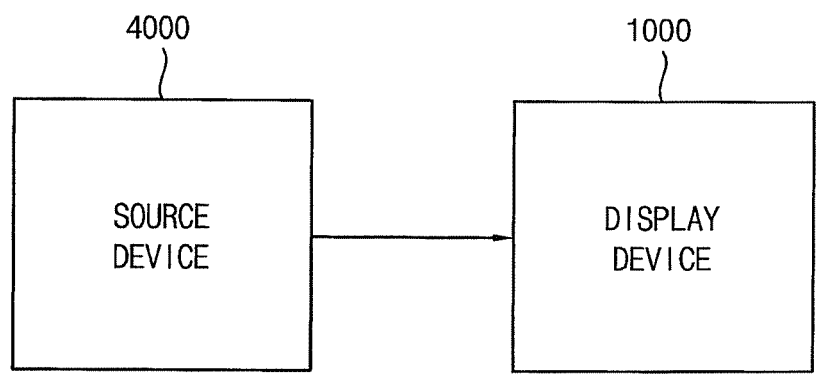
FIG. 32 is a block diagram illustrating a system including a display device of FIG. 1.

FIG. 32 is a block diagram illustrating a system including a display device of FIG. 1.

Referring to FIG. 32, a system 300 includes a source device 4000 and a display device 1000.

The source device 4000 may provide image data to the display device 1000, and the display device 1000 may display an image based on the image data. For example, the source device 4000 may be a digital versatile disc (DVD) player, a computer, a set top box (STB), a game machine, a digital camcorder, a processor of a mobile phone, or the like. The display device 1000 may be a television, a monitor, a display device of the mobile phone.

As described above, the display device according to some example embodiments may transmit data and a clock signal at high speed with no skew. Accordingly, the display device according to some example embodiments may be suitable for employing a chip-on-glass (COG) technology.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A clock and data recovery (CDR) circuit of a source driver, comprising:
   a clock recovery unit configured to receive data bits and a clock code periodically inserted into the data bits through a clock embedded data channel in a display data mode, and to generate a clock signal by detecting an edge of the clock code; and
   a delay locked loop unit configured to generate a multi-phase clock signal based on the clock signal in the display data mode,
   wherein the delay locked loop unit includes,
      a delay line configured to delay the clock signal to generate a delayed clock signal, the delay line including a plurality of delay cells, the plurality of delay cells outputting the multi-phase clock signal by sequentially delaying the clock signal,
      a phase-frequency detector configured to generate an up signal and a down signal based on a phase difference between the clock signal and the delayed clock signal,
      a control signal generator configured to generate a delay control signal for controlling a delay time of the delay line in response to the up signal and the down signal,
      a lock detector configured to generate a lock signal indicating whether the delay locked loop unit is locked based on the up signal and the down signal, and
      a clock window generator configured to generate a clock window signal by performing a logical operation on the multi-phase clock signal.

2. The CDR circuit of claim 1, wherein
   the clock recovery unit is configured to receive a clock training signal through the clock embedded data channel in a training mode, and outputs the clock training signal to the delay locked loop unit, and
   the delay locked loop unit is configured to lock in response to the clock training signal output from the clock recovery unit in the training mode.

3. The CDR circuit of claim 1, wherein
   the delay locked loop unit is configured to generate the clock window signal based on the multi-phase clock signal such that the clock window signal has a logic high level while the clock code transitions, and
   the clock recovery unit is configured to detect the edge of the clock code in response to the clock window signal.

4. The CDR circuit of claim 3, wherein the clock recovery unit comprises:
   a clock code detecting unit configured to detect the edge of the clock code in response to the clock window signal, and to generate a clock transition signal based on the detected edge;
   a clock signal generating unit configured to generate a recovered clock signal in response to the clock transition signal; and
   an output unit configured to output the recovered clock signal as the clock signal.

5. The CDR circuit of claim 4, wherein the clock code detecting unit comprises:
   a rising detector configured to generate a rising edge detection signal by detecting a rising edge of the clock code;
   a falling detector configured to generate a falling edge detection signal by detecting a falling edge of the clock code;
   a rise-fall determiner configured to generate a rise-fall decision signal by determining whether the clock code has the rising edge or the falling edge; and a selector configured to selectively output the rising edge detection signal or the falling edge detection signal as the clock transition signal in response to the rise-fall decision signal.

6. The CDR circuit of claim 4, wherein the clock signal generating unit comprises:
a delay circuit configured to generate a delayed clock transition signal by delaying the clock transition signal; and
a set-reset latch having a set terminal that receives the clock transition signal, a reset terminal that receives the delayed clock transition signal, and an output terminal that outputs the recovered clock signal.

7. The CDR circuit of claim 4, further comprising:
a delay circuit configured to delay the data bits and the clock code by a delay time of the clock code detecting unit and the clock signal generating unit in the display data mode, and to delay a clock training signal received through the clock embedded data channel by the delay time in a training mode.

8. The CDR circuit of claim 7, wherein the output unit is configured to output the clock training signal received from the delay circuit in the training mode, and is configured to output the recovered clock signal received from the clock signal generating unit as the clock signal in the display data mode.

9. The CDR circuit of claim 1, wherein the clock window generator comprises:
a window signal generating unit configured to generate a first window signal by performing a logical operation on first and second clock signals of the multi-phase clock signal, to generate a second window signal by performing a logical operation on third and fourth clock signals of the multi-phase clock signal, and to selectively output the first window signal or the second window signal as the clock window signal in response to a window selection signal, the third and fourth clock signals being respectively adjacent to the first and second clock signal; and
a window signal selecting unit configured to generate the window selection signal by detecting a time interval between a rising edge of the first window signal and the edge of the clock code.

10. A display device, comprising:
a display panel configured to display an image;
a timing controller configured to periodically insert a clock code into data bits, and to transmit the data bits and the clock code through clock embedded data channels in a display data mode; and
a plurality of source drivers configured to receive the data bits and the clock code through the clock embedded data channels in the display data mode, to generate a clock signal by detecting an edge of the clock code, to sample the data bits based on the clock signal, and to drive the display panel based on the sampled data bits.

11. The display device of claim 10, wherein
the timing controller is configured to transmit a clock training signal through the clock embedded data channels in a training mode, and CDR circuits included in the plurality of source drivers are configured to lock in response to the clock training signal received through the clock embedded data channels in the training mode.

12. The display device of claim 10, wherein the clock embedded data channels are coupled between the timing controller and the plurality of source drivers in a point-to-point topology.

13. The display device of claim 10, wherein the plurality of source drivers are configured to transmit lock state information about whether CDR circuits included in the plurality of source drivers are locked or unlocked to the timing controller through a shared back channel.

14. The display device of claim 13, wherein, when one of the CDR circuits is unlocked, a source driver including the unlocked CDR circuit is configured to change a voltage of the shared back channel to transmit the lock state information.

15. The display device of claim 13, wherein
the timing controller is configured to transmit order information to the plurality of source drivers through the clock embedded data channels; and
each source driver is configured to change a voltage of the shared back channel during a corresponding response time indicated by the order information to transmit the lock state information.

16. The display device of claim 13, wherein the shared back channel is shared by the plurality of source drivers.

17. The display device of claim 13, wherein the shared back channel is coupled between the timing controller and the plurality of source drivers in a daisy chain topology or in a multi-drop topology.

18. The display device of claim 10, wherein the timing controller is configured to transmit data packets mapped to the data bits to the plurality of source drivers through the clock embedded data channels in the display data mode, wherein the data packets respectively correspond to lines of an image frame, and wherein each data packet includes,
a line start field indicating a start of a line of the image frame;
a configuration field including configuration data for controlling the plurality of source drivers;
a pixel data field including image data;
a wait field assigned for the plurality of source drivers to have a time to receive and to store the image data; and
a horizontal blank field assigned for the plurality of source drivers to have a time to drive the display panel based on the image data.

19. The display device of claim 10, wherein the timing controller in configured to generate a modulated clock signal by adjusting at least one of a rising edge and a falling edge of a clock training signal, and is configured to transmit the modulated clock signal to the plurality of source drivers through the clock embedded data channels in a vertical training mode.

* * * * *